(12) United States Patent
Tepman

(10) Patent No.: US 6,298,685 B1
(45) Date of Patent: Oct. 9, 2001

(54) CONSECUTIVE DEPOSITION SYSTEM

(75) Inventor: Avi Tepman, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/432,544

(22) Filed: Nov. 3, 1999

(51) Int. Cl.[7] ............................................. F25D 25/00

(52) U.S. Cl. ........................................................ 62/378

(58) Field of Search ........................................ 62/378, 63

(56) References Cited

U.S. PATENT DOCUMENTS

| | | | |
|---|---|---|---|
| 3,850,105 | 11/1974 | Aronstein et al. | 104/1 R |
| 3,973,665 | 8/1976 | Giammanco | 198/19 |
| 3,976,330 | 8/1976 | Babinski et al. | 302/2 R |
| 4,047,624 | 9/1977 | Dorenbos | 214/17 B |
| 4,166,563 | 9/1979 | Peyraud et al. | 228/47 |
| 4,649,830 | 3/1987 | Tanaka | 104/138.1 |
| 4,682,927 | 7/1987 | Southworth et al. | 414/217 |
| 4,749,465 | 6/1988 | Flint et al. | 204/298 |
| 4,775,281 | 10/1988 | Prentakis | 414/416 |
| 4,829,445 | 5/1989 | Burney | 364/478 |
| 4,846,102 | 7/1989 | Ozias | 118/730 |
| 4,857,689 | 8/1989 | Lee | 219/10.71 |
| 4,870,923 | 10/1989 | Sugimoto | 118/715 |
| 4,913,929 | 4/1990 | Moslehi et al. | 427/39 |
| 4,951,601 | 8/1990 | Maydan et al. | 118/719 |
| 4,985,722 | 1/1991 | Ushijima et al. | 354/319 |
| 4,989,543 | 2/1991 | Schmitt | 118/723 |
| 5,001,327 | 3/1991 | Hirasawa et al. | 219/390 |
| 5,060,354 | 10/1991 | Chizinsky | 29/25.02 |
| 5,086,729 | 2/1992 | Katagiri | 118/729 |
| 5,110,249 | 5/1992 | Norman | 414/217 |
| 5,178,638 | 1/1993 | Kaneko et al. | 29/25.01 |
| 5,187,115 | 2/1993 | Coleman | 437/101 |
| 5,203,443 | 4/1993 | Toriumi et al. | 198/341 |
| 5,227,708 | 7/1993 | Lowrance | 318/640 |
| 5,252,807 | 10/1993 | Chizinsky | 219/390 |

(List continued on next page.)

FOREIGN PATENT DOCUMENTS

| | | |
|---|---|---|
| 2114 470 | 9/1972 | (DE) . |
| 3941110A1 | 6/1990 | (DE) . |
| 0 359 525 A2 | 3/1990 | (EP) . |
| 0 608 633 B1 | 8/1994 | (EP) . |
| 0 684 630 A2 | 11/1995 | (EP) . |
| 0 756 316 A1 | 1/1997 | (EP) . |
| 2284 105 | 5/1995 | (GB) . |
| 63-141342 | 6/1988 | (JP) . |
| 3-136345 | 6/1991 | (JP) . |
| 4-164718 | 6/1992 | (JP) . |
| 59-53320 | 3/1994 | (JP) . |
| 8-274142 | 10/1996 | (JP) . |
| WO 94/00868 | 1/1994 | (WO) . |

OTHER PUBLICATIONS

PCT International Search Report on Serial No. PCT/US 99/11060, dated May 13, 1999.

*Primary Examiner*—William Doerrler
*Assistant Examiner*—Malik N. Drake
(74) *Attorney, Agent, or Firm*—Thomason, Moser & Patterson, LLP

(57) ABSTRACT

The present invention generally provides a system for processing substrates having a carrier disposed primarily in at least one processing chamber and at least one shuttle for transferring substrates between the processing chamber and a load lock chamber. A plurality of processing chambers, load lock chambers, and other chambers can be joined to create a series of modular chambers through which the substrates are processed. Preferably, the carrier is only exposed to the processing environment, i.e., the carrier does not shuttle into a non-processing chamber. Thus, during continuous sequential processing of substrates, thermal cycling of the carrier is reduced. The carrier is reversibly moved within the processing chamber along a track. Multiple processing zones separated by partitions allow a plurality of processing regimes to occur within the same processing chamber.

49 Claims, 14 Drawing Sheets

U.S. PATENT DOCUMENTS

| | | | |
|---|---|---|---|
| 5,259,883 | 11/1993 | Yamabe et al. | 118/725 |
| 5,275,709 | 1/1994 | Anderle et al. | 204/298.25 |
| 5,288,379 | 2/1994 | Namiki et al. | 204/192.12 |
| 5,292,393 | 3/1994 | Maydan et al. | 156/345 |
| 5,352,294 | 10/1994 | White et al. | 118/725 |
| 5,355,066 | 10/1994 | Lowrance | 318/640 |
| 5,377,816 | 1/1995 | Deligi et al. | 198/619 |
| 5,382,126 | 1/1995 | Hartig et al. | 414/217 |
| 5,425,611 | 6/1995 | Hughes et al. | 414/217 |
| 5,447,409 | 9/1995 | Grunes et al. | 414/744.6 |
| 5,469,035 | 11/1995 | Lowrance | 318/568.1 |
| 5,470,784 | 11/1995 | Coleman | 437/101 |
| 5,512,320 | 4/1996 | Turner et al. | 427/255 |
| 5,535,306 | 7/1996 | Stevens | 395/89 |
| 5,536,128 | 7/1996 | Shimoyashiro et al. | 414/273 |
| 5,537,311 | 7/1996 | Stevens | 364/167.01 |
| 5,607,009 | 3/1997 | Turner et al. | 165/48.1 |
| 5,611,865 | 3/1997 | White et al. | 118/725 |
| 5,674,786 | 10/1997 | Turner et al. | 437/225 |
| 5,700,127 | 12/1997 | Harada et al. | 414/416 |
| 5,701,627 | 12/1997 | Matsumura et al. | 15/88.2 |
| 5,846,328 | 12/1998 | Aruga et al. | 118/718 |
| 5,879,128 | 3/1999 | Tietz et al. | 414/757 |
| 5,881,649 | 3/1999 | Hasegawa et al. | 104/167 |
| 5,883,017 | 3/1999 | Tepman et al. | 438/800 |
| 5,976,199 | 11/1999 | Wu et al. | 29/25.01 |
| 6,013,134 | 1/2000 | Chu et al. | 118/715 |

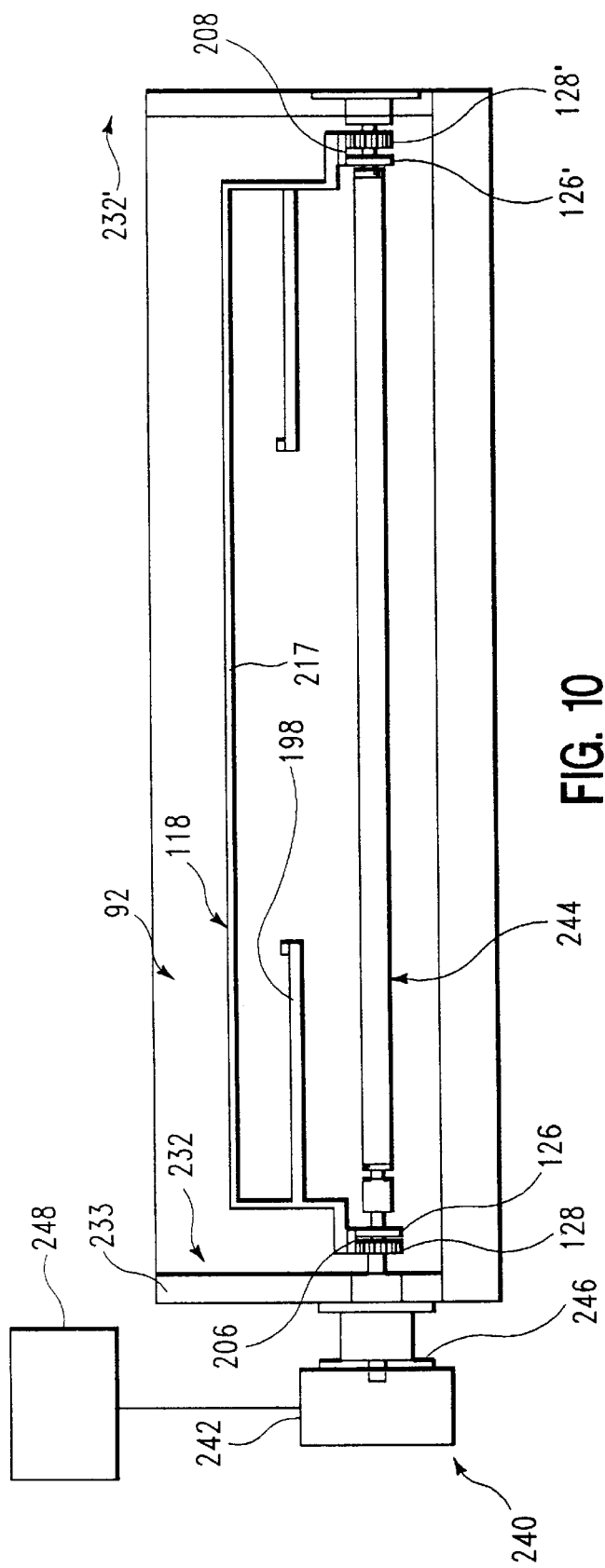
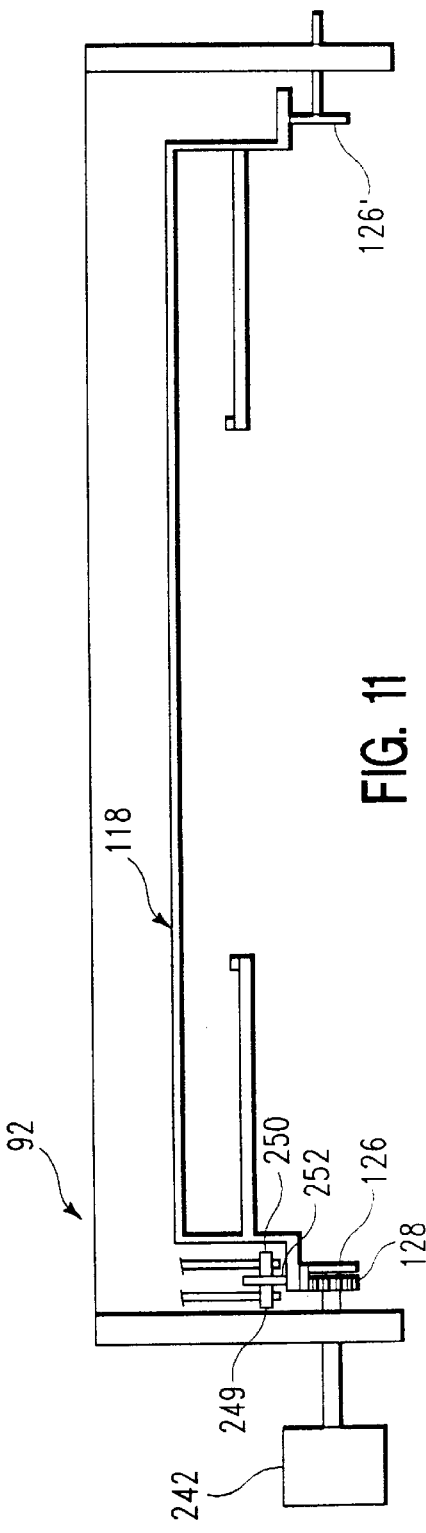
FIG. 10
FIG. 11

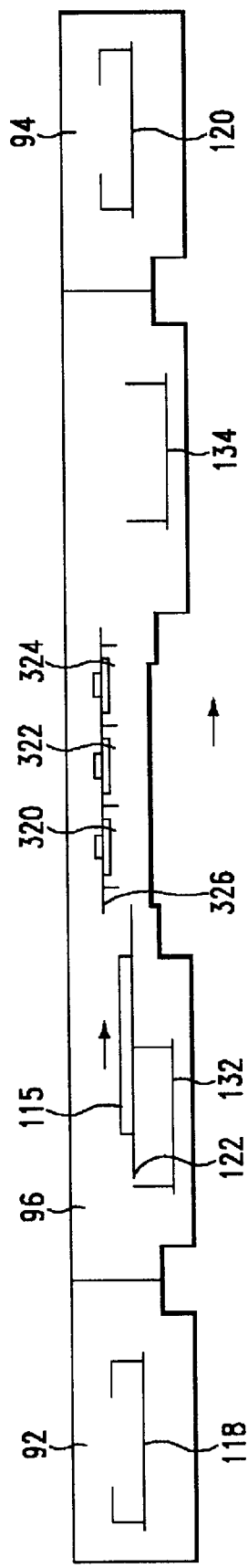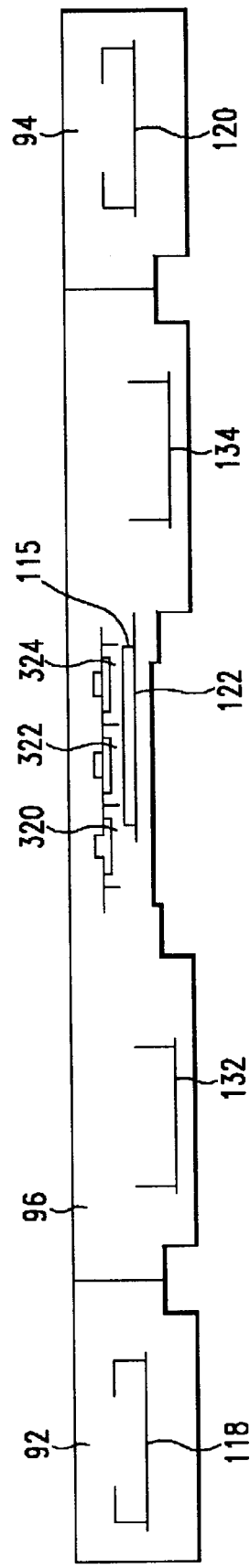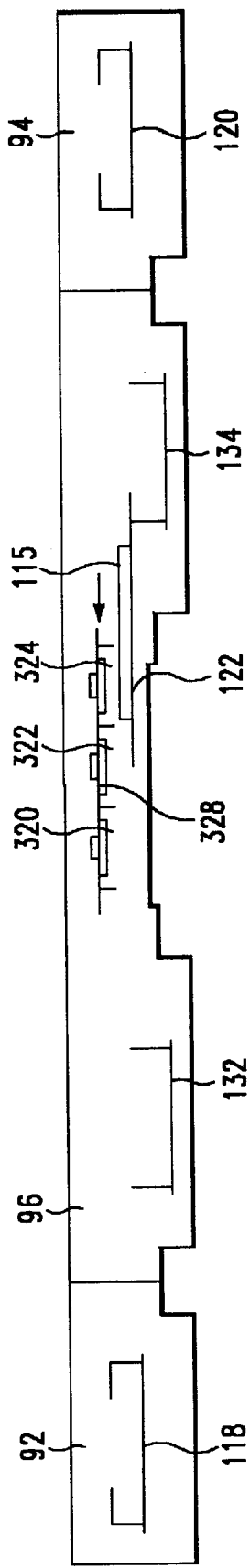

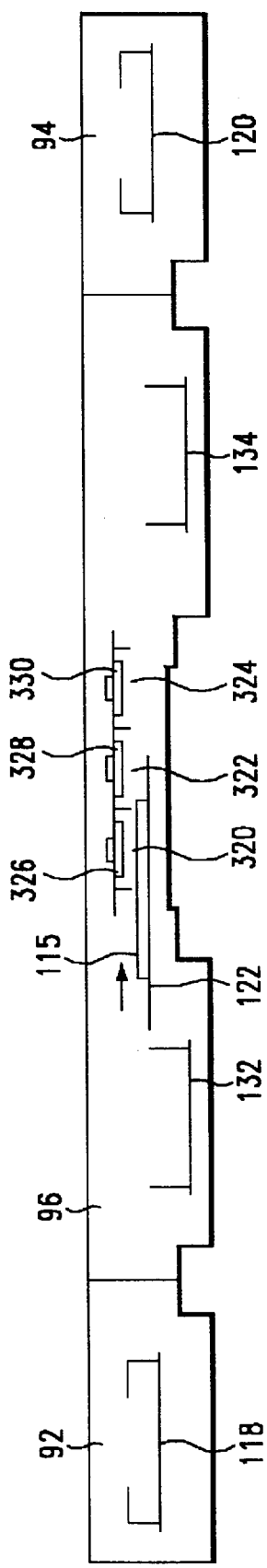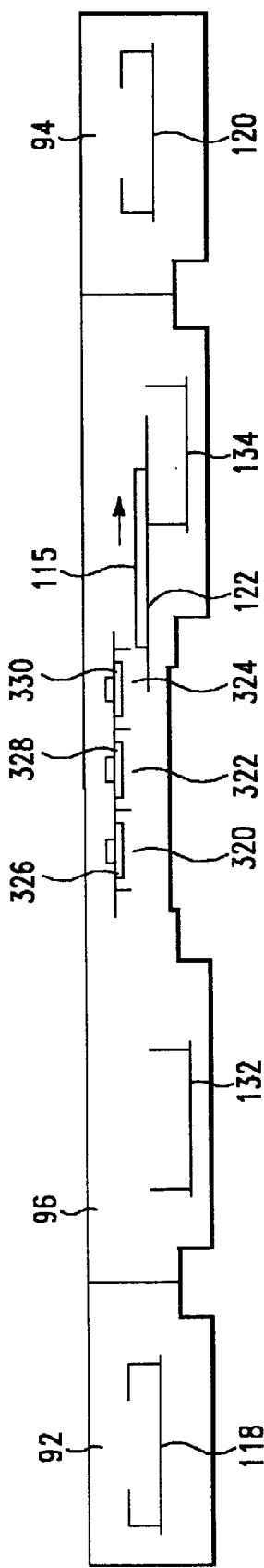
FIG. 22
FIG. 23

CONSECUTIVE DEPOSITION SYSTEM

BACKGROUND OF THE INVENTION

1. Field of the Invention

The present invention relates to the field of semiconductor processing. More specifically, the invention relates to an apparatus and method for carrying substrates through a processing system.

2. Background of the Related Art

In the semiconductor industry, there are two primary methods of moving substrates through a processing system. One traditional method uses a cluster tool arrangement shown in FIG. 1. A cluster tool platform 2 generally refers to a modular, multi-chamber, integrated processing system. It typically includes central wafer handling vacuum chambers 20, 32 and a number of peripheral processing chambers 24, 26, 28, and 36. Substrates such as wafers 22, typically stored in cassettes 10, are loaded and unloaded from load locks 12, 14 and processed under vacuum in various processing chambers without being exposed to ambient conditions. The transfer of the wafers for the processes is managed by a centralized robot 16 in a wafer handling vacuum chamber 20 or robot 30 in a second wafer handling vacuum chamber 32 which are maintained under vacuum conditions. A microprocessor controller 38 and associated software is provided to control processing and movement of wafers.

For relatively large substrates, such as glass substrates, ceramic plates, plastic sheets, and disks, a second method of moving substrates through a processing system, referred to as an inline system, is typically used. Glass substrates are used in the manufacture of flat panel displays, which are used as active matrix televisions, computer displays, liquid crystal display (LCD) panels, and other displays. A typical glass substrate has dimensions of about 550 mm by 650 mm and the trend is to increase the substrate size to about 650 mm by 830 mm and larger.

FIG. 2 is a schematic side view of a typical modular inline system 40. The processing system includes a serial arrangement of processing chambers 42, 44 disposed between a load chamber 46 and an unload chamber 48 on the ends of the series of processing chambers. An elevator 50 is disposed at an entry to the load chamber 46 and another elevator 52 is disposed at an exit from the unload chamber 48. The processing chambers, such as processing chamber 44, may include deposition chambers, such as chemical vapor deposition (CVD) chambers, physical vapor deposition (PVD) chambers, etch chambers, electroplating chambers, and other sputtering and processing chambers. A carrier return line 58 is disposed above the processing chambers and coupled to the elevators 50, 52. The various processing chambers are under vacuum or low pressure and are separated by one or more isolation valves 60, 62, 64, 66, 68 as shown in the schematic top view of the inline system in FIG. 3. Typically, multiple substrates 54, 56, 70, 72 are supported by a carrier 74, as shown in the schematic front view and side view of the carrier in FIGS. 4 and 5. The isolation valves seal the respective chambers from each other in a closed position and allow the substrates 54, 56 to be transferred through the valves to an adjacent station in an open position.

A carrier 74, shown in FIG. 2, is placed adjacent the elevator 50 where the substrates 54, 56, 70, 72 are manually loaded onto the carrier 74 at a receiving station 51. A door (not shown) to the elevator 50 opens and allows the carrier 74 to be placed within the elevator on a track (not shown). The temperature and pressure inside the elevator 50 is typically at ambient conditions. An isolation valve 60 opens and allows the carrier 74 to be moved on the track into a load chamber 46. The load chamber 46 is sealed and pumped down to a typical vacuum in the range of about 10 mTorr to about 50 mTorr for CVD processing and about 1 mTorr to about 5 mTorr for PVD processing. Another isolation valve 62 is opened and the carrier 74 is moved into a processing chamber 42, where the substrates are heated to a temperature suitable for processing. Another isolation valve 64 is opened and the carrier 74 is moved along the track into the processing chamber 44. If the processing chamber 44 is a sputtering process chamber, the chamber can include a plurality of targets 76, 78 that sputter material from the surface of the targets facing the substrates onto the substrates 54, 56, 70, 72 as the substrates move along the track adjacent each target. Each sputtering target is bombarded on the side facing the substrate with ionized gas atoms (ions) created between an anode (typically the target) and a cathode (typically the grounded chamber wall) and particles of the target are dislodged and directed toward the substrates for deposition on the substrates. Each target preferably has a magnet (not shown) disposed on the back side of the target away from the substrates to enhance the sputtering rate by generating magnetic field lines generally parallel to the face of the target, around which electrons are trapped in spinning orbits to increase the likelihood of a collision with, and ionization of, a gas atom for sputtering. The substrates 54, 56, 70, 72 are then moved to an unloading chamber 48 through isolation valve 66. Isolation valve 66 closes, thereby sealing the processing chamber 44 from the unload chamber 48. Isolation valve 68 opens and allows the carrier 74 to be removed from the unloading chamber 48 and the substrates 54, 56, 70, 72 are typically unloaded manually from the carrier. The substrates can also be detained in the unloading chamber to allow time for the substrates to cool. After the substrates have been unloaded, the carrier 74 enters the elevator 52, whereupon the elevator lifts the carrier 74 to the return line 58. A track system (not shown) in the return line 58 returns the carrier to the elevator 50, which lowers the carrier into position at the receiving station 51 on the other end of the processing system to receive a next batch of substrates to be processed.

While the inline system 40 is currently used for production, this type of inline system has several disadvantages. The carrier 74 undergoes thermal cycling as it is moved from a processing environment to an ambient environment in the elevators 50, 52 and carrier return line 58 and back into a processing environment. As a result, deposition material may peel off or be otherwise dislodged from the carrier 74 and cause unwanted particle inclusion on the substrates. Additionally, the track system can generate contaminants in operation that become attached to the carrier and can be brought into the processing chamber. The elevators and track system add a level of complexity to the system and maintenance is required of the various moving components to reduce breakdowns. Additionally, the carrier 74 will absorb oxygen in the ambient environment, which can increase the chamber pressure and cause contamination of deposited film layers when oxygen outgasses therefrom in the vacuum chamber. In addition to the thermal cycling of the carrier 74, the mean temperature of the carrier 74 typically rises as multiple sets of substrates are processed therewith at temperatures above ambient conditions. Most processes in processing chambers are temperature sensitive and typically a processing regime establishes a desired operating temperature to obtain consistent depositions. Consequently, heat transfer from the carrier 74 can affect the substrate and/or process and the films created at the beginning of production can vary compared to films created at the end of production with the increased mean temperature. Yet another challenge with the typical inline system is cross contamination between processes in adjacent processing chambers, especially those chambers using a reactive process. Reactive processing depends on two or more constituents in proper proportions. An influx of other materials from adjacent processing chambers can cause the reactive processing to be unstable and affect the deposition characteristics.

Therefore, there remains a need for an improved system and method for processing substrates, particularly relatively flat glass substrates.

SUMMARY OF THE INVENTION

The present invention generally provides a system for processing substrates having a carrier disposed primarily in at least one processing chamber and at least one shuttle for transferring substrates between the processing chamber and a load lock chamber. A plurality of processing chambers, load lock chambers, and other chambers can be joined to create a series of modular chambers through which the substrates are processed. Preferably, the carrier is only exposed to the processing environment, i.e., the carrier does not shuttle into a nonprocessing chamber. Thus, during continuous sequential processing of substrates, thermal cycling of the carrier will be reduced. The carrier is reversibly moved within the processing chamber along a track. Multiple processing zones separated by partitions allow a plurality of processing regimes to occur within the same processing chamber.

In one aspect, the invention provides a substrate processing system, comprising at least one processing chamber, at least one load lock chamber coupled to the processing chamber, a shuttle disposed in the load lock chamber and communicable with the processing chamber, and a substrate carrier primarily disposed in the at least one processing chamber and adapted to operate solely within the processing chamber.

In another aspect, the invention provides a processing system, comprising at least one processing chamber, at least one load lock chamber coupled to the processing chamber, a shuttle movable between a load lock chamber and the processing chamber, and a temperature controllable substrate carrier disposed at least partially in the processing chamber. The substrate carrier temperature is controlled by disposing a temperature controllable plate(s) adjacent the carrier that contacts and/or radiates preferably a cooler temperature to the carrier.

In another aspect, the invention provides a processing system, comprising at least one processing chamber, at least one load lock chamber coupled to the processing chamber, a shuttle movable between a load lock chamber and the processing chamber, and at least two processing zones within one processing chamber.

In another aspect, the invention provides a substrate processing apparatus, comprising a plate, one or more channels disposed at least partially within the plate and having an outlet and an inlet, and a plurality of upward projecting pins connected to the plate that engage a substrate carrier in a substrate processing system.

In another aspect, the invention provides a substrate processing system, comprising a substrate carrier, a temperature controllable plate disposed in proximity to the substrate carrier, and a fluid channel coupled to the temperature controllable plate.

In another aspect, the invention provides a method of processing substrates, comprising disposing a substrate in a processing chamber, positioning the substrate adjacent a first processing zone disposed at least partially within the processing chamber, processing the substrate with a first process in the first processing zone, positioning the substrate adjacent a second processing zone disposed at least partially within the processing chamber, and processing the substrate in the second processing zone with a different process than the first process in the first processing zone.

In another aspect, the invention provides a method of processing substrates, comprising transferring a substrate to a carrier disposed in a processing chamber, processing the substrate in the processing chamber, and then transferring the substrate from the carrier to a space outside the processing chamber.

In another aspect, the invention provides a method of processing substrates, comprising disposing a substrate carrier in a processing chamber, supporting a substrate on the substrate carrier, processing a substrate in the processing chamber, and altering a substrate carrier temperature inside the processing chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 10 is a schematic of another chamber cross section showing a pinion.

FIG. 11 is a schematic of an alternative embodiment of the drive mechanism shown in FIG. 10.

FIGS. 19–23 are schematic diagrams of an exemplary process sequence.

DETAILED DESCRIPTION OF THE PREFERRED EMBODIMENT

The present invention generally provides an inline processing system having one or more chambers and a substrate carrier disposed in the system to support and transfer a substrate through the one or more chambers. In one aspect, the invention includes loading and unloading load lock chambers. A transfer shuttle is disposed in each load lock chamber to transfer substrates to and from the carrier in the system. Also, reactive processes and non-reactive processes can be performed in a single processing chamber through use of partitions between processing zones in the processing chamber. The partitions allow the reactive processing to occur without the traditional isolation valves between each discrete process.

Figure 6:
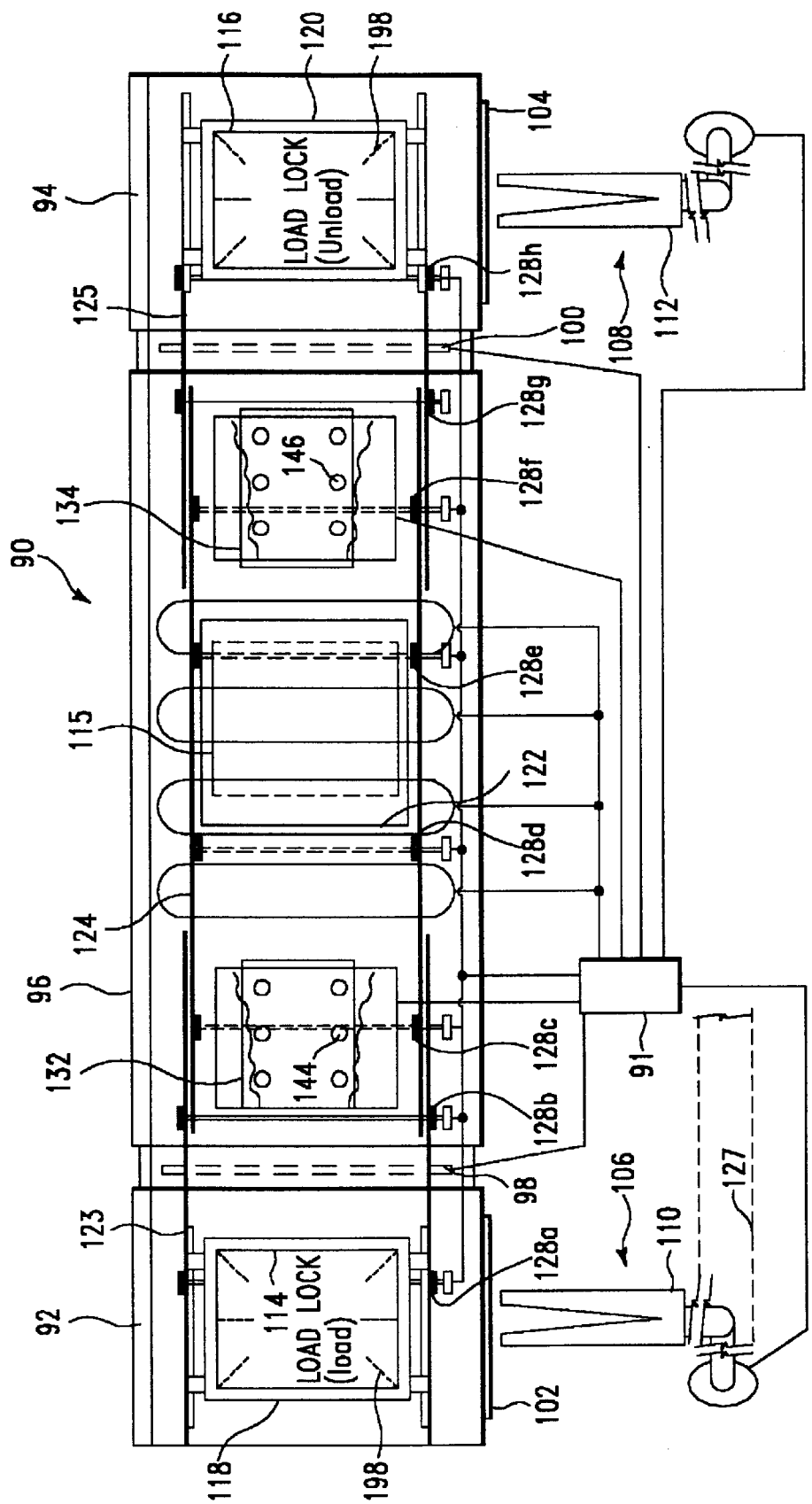
FIG. 6 is a schematic top view of a consecutive deposition inline system of the present invention.
Figure 7:
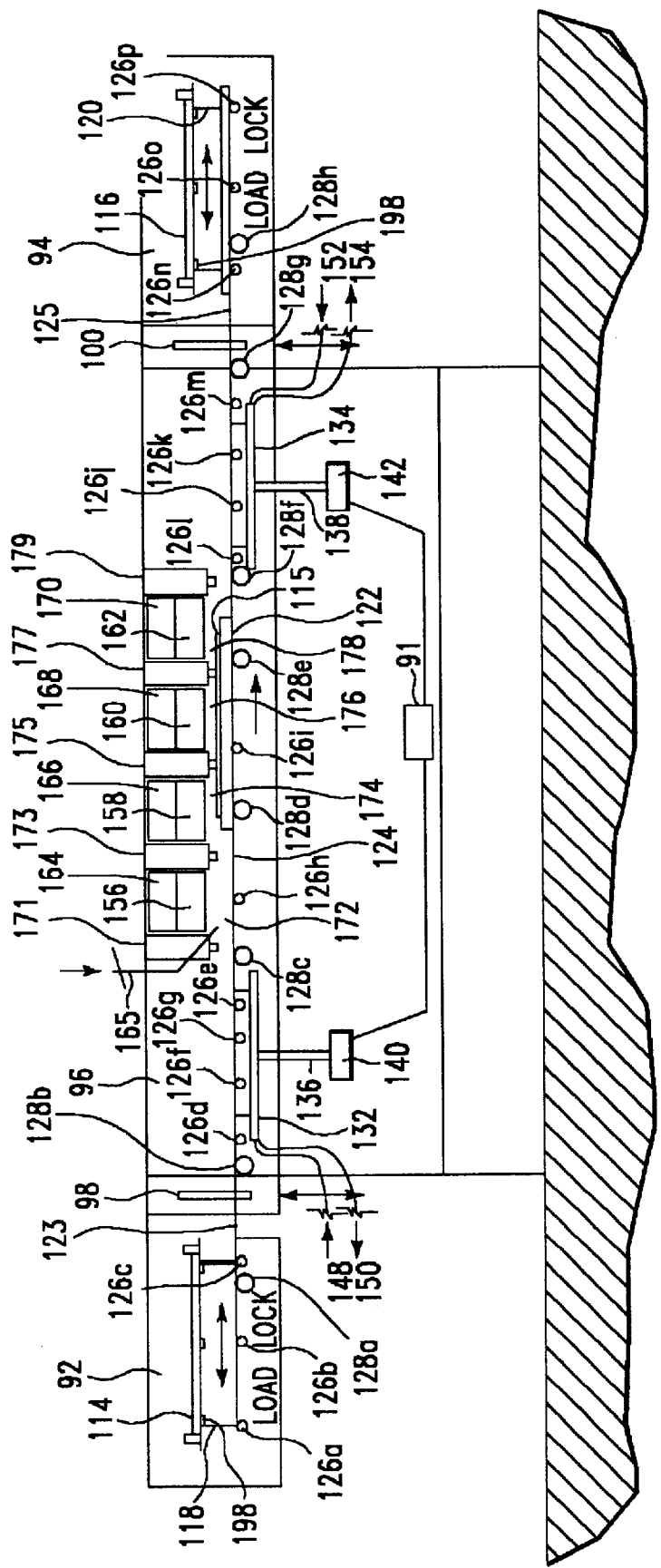
FIG. 7 is a schematic side view of the consecutive deposition inline system shown in FIG. 6.

FIGS. 6 and 7 are schematic top and side views of a consecutive deposition inline system 90, respectively. The system 90 includes a loading load lock chamber 92 on one end of the system 90, an unloading load lock chamber 94 disposed on the other end of the system 90, and at least one process chamber 96 disposed therebetween. The loading load lock chamber 92 is isolated from the process chamber by an isolation valve 98. The loading load lock chamber 92 also includes a valve 102 that opens to a receiving station 106 that is serviced by a robot 110. The robot 110 delivers a substrate 114 to the loading load lock chamber 92. Similarly, the unloading load lock chamber 94 is isolated from the process chamber by an isolation valve 100. The unloading load lock chamber 94 also includes a valve 104 that opens to a receiving station 108 that is serviced by a robot 112. The robot 112 retrieves a substrate 116 from the unloading load lock chamber 94. Alternatively, the system can include a track type robot that services both load lock chambers by moving along a track 127 disposed adjacent the chambers. The robot is known as an atmospheric robot and is commercially available from such manufacturers as MECS, RORTZ, JEL, Daihen, Komatsu and other manufactures known to those in the art.

At least one shuttle 118 is disposed in the loading load lock chamber 92 and at least one other shuttle 120 is disposed in the unloading load lock chamber 94. The shuttles 118, 120 are moved in and out of the load lock chambers 92, 94 and into opposite ends of the processing chamber 96 in a reversing direction through use of one or more reversible motors or gear assemblies to enable the shuttles to transfer a substrate to and from the processing chamber 96 and then retract the shuttles from the processing chamber back to their respective load lock chambers. At least one carrier 122 is disposed in the process chamber 96 to support a substrate and is movable in both directions, i.e., reversible in the direction of both the loading load lock chamber 92 and the unloading load lock chamber 94.

Preferably, three tracks are disposed in the system 90 for movement of the shuttles 118, 120 and carrier 122 and each track comprises a plurality of guide rollers 126a–p (generally guide roller 126) and pinion gears 128a–h (generally pinion 128). Separate tracks 123, 125 support movement of the shuttles 118, 120 between the process chamber 96 and their respective load lock chambers. A third carrier track 124 supports the carrier 122 for movement in the process chamber 96. The tracks are formed by aligning a plurality of guide rollers and/or pinion gears and can include side rails (not shown). The quantity of guide rollers 126 and pinion gears 128 along each track can vary depending on factors such as the length of the chambers, the length of the shuttles and carrier, and the size of the substrate. A shuttle track 123 is disposed in the loading load lock chamber 92 and extends into the processing chamber 96. The shuttle track 123 comprises guide rollers 126 and pinion gears 128 disposed in the lower portion of the system 90 and provides a path for movement of the shuttle 118 within the chambers 92 and 96. Similarly, another shuttle track 125 is disposed in the unloading load lock chamber 94 and extends into the processing chamber 96. The shuttle track 125 comprises a plurality of guide rollers 126 and pinion gears 128 and provides a path for movement of the shuttle within the chambers 94 and 96. The carrier track 124 preferably extends between the isolation valves 98, 100 and provides a path for movement of the carrier 122 within the chamber 96 as the substrates 114, 115, 116 are processed. The carrier track 124 is narrower in width than the shuttle tracks 123, 125 and comprises a plurality of guide rollers 126 and pinion gears 128. The narrower width of the carrier track 124 allows the carrier 122 to be positioned under the shuttles 118, 120 for a substrate transfer between the shuttle and the carrier. The guide rollers 126 and pinion gears 128 can be spaced along the tracks 123, 124, 125 at appropriate intervals so that each rail on the carrier 122 and the shuttles 118, 120 is supported on at least at two points as the carrier and shuttles are moved along their respective tracks. While preferably the carrier track 124 has a different width, i.e., spacing between the track rails, than the shuttle tracks 123, 125, other simpler mechanisms and more complicated mechanisms can be used for delivering substrates between the load lock chambers 92, 94 and the processing chamber 96, including cantilevered assemblies, robots and V-shaped shuttles and/or carriers similar to the robot blades of robots 110, 112.

A pin plate 132 is disposed at the end of the process chamber 96 adjacent the loading load lock chamber 92. The pin plate 132 can be made of heat conductive material, such as aluminum or copper. The pin plate 132 is coupled to a shaft 136 and a lift motor 140. A plurality of pins 144 are connected to the pin plate 132 and upwardly disposed from the plate. The temperature of the pin plate 132 can be controlled and preferably cooled with a coolant through coolant inlet line 148 and outlet line 150, as described in reference to FIG. 12. Similarly, a pin plate 134 is disposed at the end of the process chamber 96 adjacent the unloading load lock chamber 94. The pin plate 134 is coupled to a shaft 138 and a lift motor 142. The pin plate 134 includes a plurality of pins 146 upwardly disposed from the plate. Similarly, the temperature of the pin plate 134 can be controlled and preferably cooled with a coolant through inlet line 152 and outlet line 154.

As best viewed in FIG. 7, the processing chamber may include one or more processing zones wherein one or more processing environments may be maintained as the substrates are passed therethrough. For example, one or more targets 156, 158, 160, 162 can be disposed above the substrate 115 in the processing chamber 96 if, for instance, the processing chamber is a sputtering chamber. Similarly, showerheads (not shown) for CVD or etch processing and other components for other types of processing can be disposed adjacent the substrate depending on the processing needs. Partitions 164, 166, 168, 170 are disposed intermediate each of the targets 156, 158, 160, 162 and at the non-adjacent sides of each of targets 156, 162. The partitions preferably separate each target from adjacent targets to define a series of processing zones, such as the four processing zones 172, 174, 176, 178, within the processing chamber 96. Each zone may be shorter in length than the linear dimension of a substrate being calTied therethrough, so that only a portion of the substrate, i.e., a full width and partial length, is exposed to the process environment of a single zone at one time, although the substrate may be simultaneously exposed to multiple processing zones at different substrate locations. For systems with more than one processing chamber, one or more processing zones can be included in each processing chamber. The lower portions of the processing zones 172, 174, 176, 178 arc open to the processing environment of the processing chamber 96, so that a substrate being processed can move from one processing zone to another processing zone without necessitating entry into other processing chambers through isolation valves. Each partition preferably extends to a position in close proximity to the substrate 115 to be processed, preferably about 1 mm to about 5 mm away from the substrate as the substrate is being processed. One or more of the processing zones can be adapted to provide a reactive process by including a gas inlet 165 for a reactive gas entering the processing zone. The reactive gases can be flown into the processing zone, for example, during sputtering of a target and react with the substrate and/or sputtered material for reactive processing. The same processing zone used for reactive processing can be used for non reactive processing by not flowing reactive gases into the processing zone.

Because the processing is performed in the processing regions, for larger substrates, the isolation valve 98 adjacent the loading load lock chamber 92 can be opened to provide clearance for the substrate 115 to move completely through the processing zones 172, 174, 176, 178. Similarly, the isolation valve 100 adjacent the unloading load lock chamber 94 can be opened to provide clearance for the substrate. Also, the speed of the carrier 122 can be varied depending on whether the substrate 115 is being transferred or otherwise moved along the track 124 to a processing zone, or the substrate is being processed in a processing zone. The speed is selected in the process zone to provide the desired thickness of deposition or completion of etching based on a multiplier of process rates times the duration of each point on the substrate in the process region. The speed of the carrier 122 preferably is about 5 mm/sec to about 20 mm/sec during deposition and about 100 mm/sec to about 200 mm/sec during transfer.

A controller 91 is used to control various functions in the system such as the movements of the substrate carrier, pin plates, shuttles, pinions on the tracks, valves, and other associated system features. The controller 91 preferably comprises a programmable microprocessor and executes system control software stored in a memory, which in the preferred embodiment is a hard disk drive, and can include analog and digital input/output boards, interface boards, and stepper motor controller boards (not shown). The controller 91 controls electrical power to the components of the system and includes a panel that allows an operator to monitor and operate the system. Optical and/or magnetic sensors (not shown) are generally used to move and determine the position of movable structures and assemblies.

Figure 8:
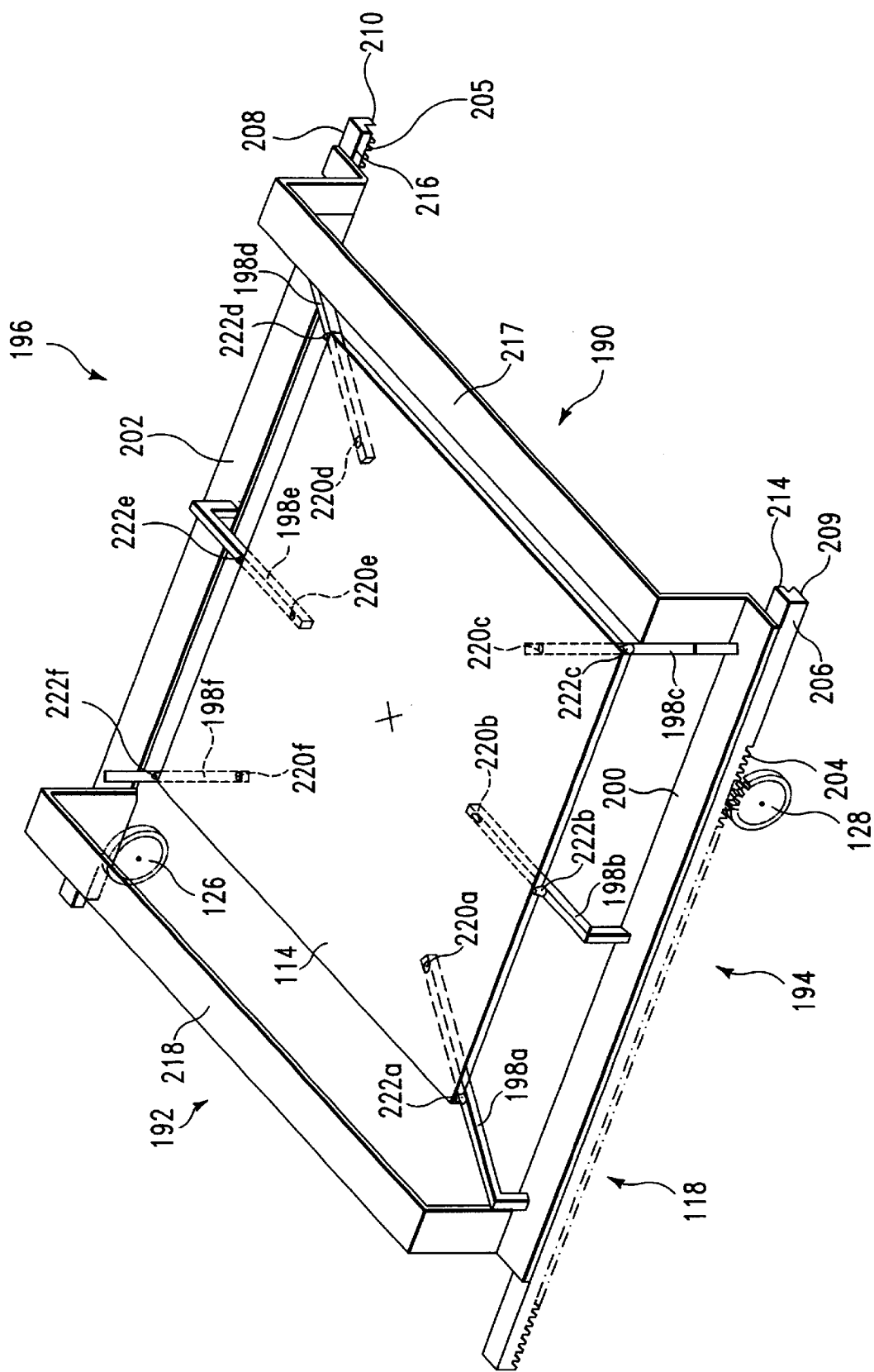
FIG. 8 is a schematic perspective view of a shuttle.

FIG. 8 is a schematic perspective view of a shuttle disposed in each load lock chamber. Each shuttle has a first end 190 and a second end 192 opposite the first end 190. Each shuttle further has a first side 194 and a second side 196 and support fingers 198a–f (generally support fingers 198) extending inward from the outer periphery of the shuttle 118, such as transverse to or at angles to the sides 194, 196 and ends 190, 192. Each shuttle includes a first side rail 200 along the first side 194 and a second side rail 202 along the second side 196. The side rails 200, 202 are parallel to and spaced apart from each other by cross members 217, 218. The cross members 217, 218 are spaced from the fingers 198 by a distance greater than the thickness of a substrate processed in the system to allow the pin plates 132, 134, shown in FIG. 7, to lift the substrate from the fingers and the shuttles 118, 120 to retract from the respective pin plate while the pin plate supports the substrate. The side rails 200, 202 include toothed racks 206, 208 on lower surfaces 209, 210, respectively. The toothed racks 206, 208 includes teeth 204, 205, respectively, which are adapted to engage a pinion gear 128, represented in dashed lines in FIG. 8. Inward stepped surfaces 214, 216 on each respective rail are adapted to engage a guide roller 126.

The ends of the support fingers 198 can include one or more support pads 220a–f (generally support pads 220) that extend upward from the fingers and upon which the substrate 114 is supported. Finger guides 222a–f (generally finger guides 222) are disposed outward from the support pads 220 and form a surface against which the substrate 114 can be laterally positioned. The support fingers 198 are positioned on the shuttle 118 to allow the pins 144 in the pin plate 132 to support the substrate 114 above the fingers and the shuttle 118 to be able to retract from the processing chamber 96 after delivering the substrate to the processing chamber without interference between the support fingers and the pins. The lower portions of the support fingers 198 and cross members 217, 218 are preferably at a higher elevation than an upper surface of the carrier 122, shown in FIG. 6, to allow the shuttle 118 to be positioned over the carrier 122 for a substrate transfer. The shuttle 118 can be exposed to temperatures of about 600° C. or more and, thus, the shuttle 118 can be made of stainless steel, ceramics, Invar 36®, or other temperature resistant materials. Similarly, the pads are preferably made of material such as ceramic, stainless steel, quartz, or other temperature resistant materials. The shuttle 120 in unloading load lock chamber 94 is similarly designed as shuttle 118.

Figure 9:
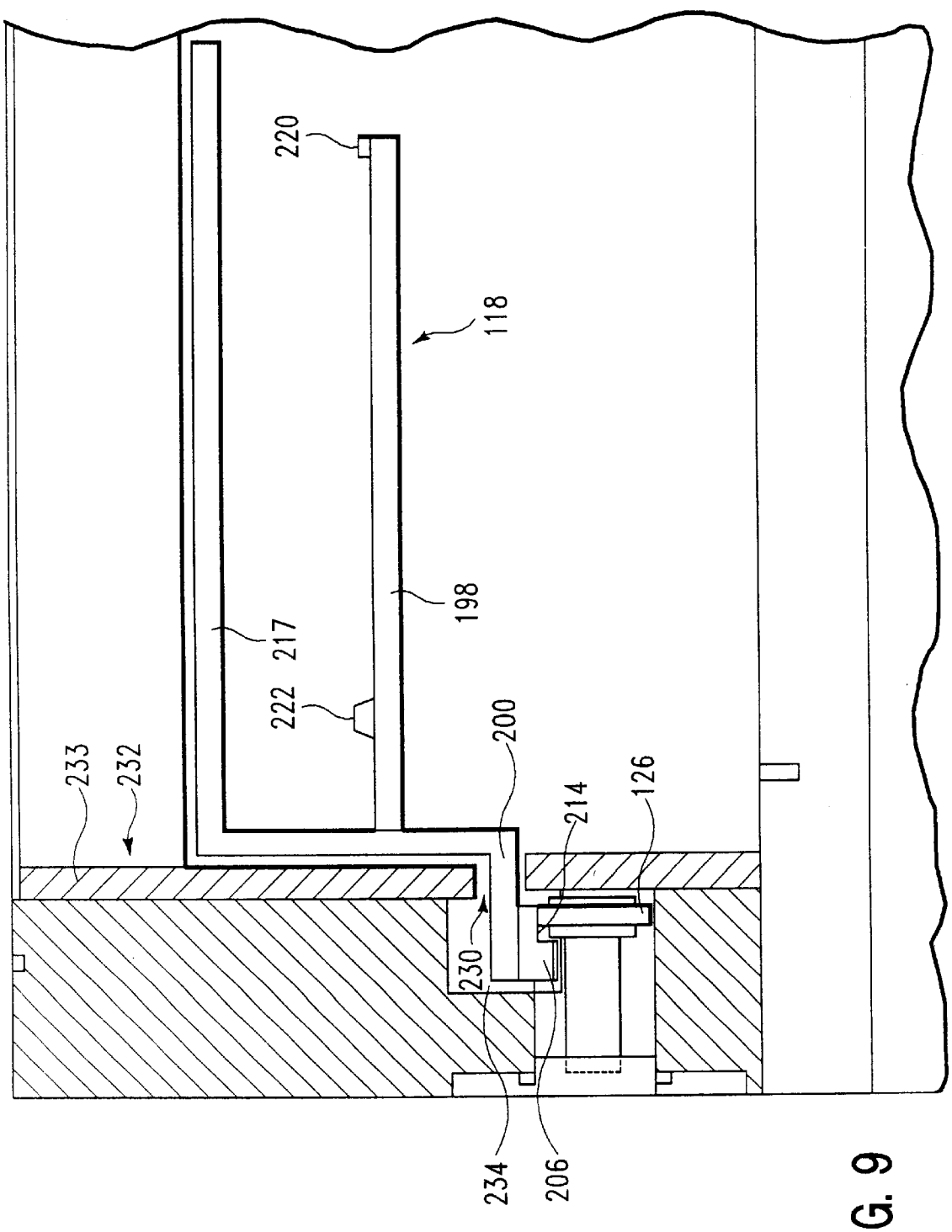
FIG. 9 is a partial schematic cross section of a chamber.

FIG. 9 is a partial schematic cross section of a chamber, showing the arrangement of the rail 200 and track 123 or 125. Preferably, an enclosed slot 230 is disposed in an interior chamber wall 233 to allow the rail 200 of the shuttle 118 to extend into the opening 234 of the interior wall. The inboard portion 214 of the rail 200 engages a guide roller 126 on the tracks 123, 125, shown in FIGS. 6 and 7. The slot 230 also reduces contamination caused by the guide rollers 126 by more fully separating the processing environment from the components of the track 123, 125. A similar arrangement can be provided for the carrier 122 on the track 124.

FIG. 10 is a schematic of another chamber cross section showing a pinion 128 engaged to a shuttle 118. The outside chamber walls are not shown in this schematic. A drive mechanism 240 includes a motor 242 external to the interior wall 233 of the particular chamber, such as loading load lock chamber 92, coupled to a drive shaft assembly 244 that extends into the chamber 92. The motor 242 can be a reversible motor which can move the shuttles and/or carrier in different directions. The motor can include gear box(es) which can be reversible. The drive shaft assembly 244 is coupled to a first pinion 128 adjacent a first side 232 and a second pinion 128' adjacent a second side 232' of an associated chamber. The drive shaft assembly 244 is also coupled to a first guide roller 126 disposed inboard of the first pinion 128 and to a second guide roller 126' disposed inboard of the second pinion 128'. The pinion 128 is configured to mesh with the toothed rack 206 and the pinion 128' is configured to mesh with the toothed rack 208 of the shuttle 118 and with similar racks on the substrate carrier 122, shown in FIG. 9. The drive mechanism 240 can also include an encoder 246 that provides input to a controller 248, responsive to the rotation of the drive shaft assembly 244. The controller 248 can connect one or more drive mechanisms 240 for sequenced or simultaneous operation of the drive mechanisms or some combination thereof.

FIG. 11 is a schematic of an alternative embodiment of the drive mechanism 240, shown in FIG. 10, in which the motor 242 drives the pinion 128 without the drive shaft assembly 244. A plurality of lateral guide rollers 249, 250 are mounted to the particular chamber adjacent the guide rollers 126 on the tracks 123, 125, shown in FIGS. 6-7. A similar arrangement can be provided for the carrier 122 on the track 124. The lateral guide rollers 249, 250 engage an upwardly extending guide rail 252 on the shuttle 118 (or carrier 122) to ensure the shuttles or carrier move in an aligned lateral direction along their respective tracks. Guide rollers 126, 126' support the shuttle or the carrier. The guide rollers can be Teflon®-coated aluminum, Vespel®, or any other such material that preferably does not significantly generate particulates and is soft for dampening vibrations.

Figure 12:
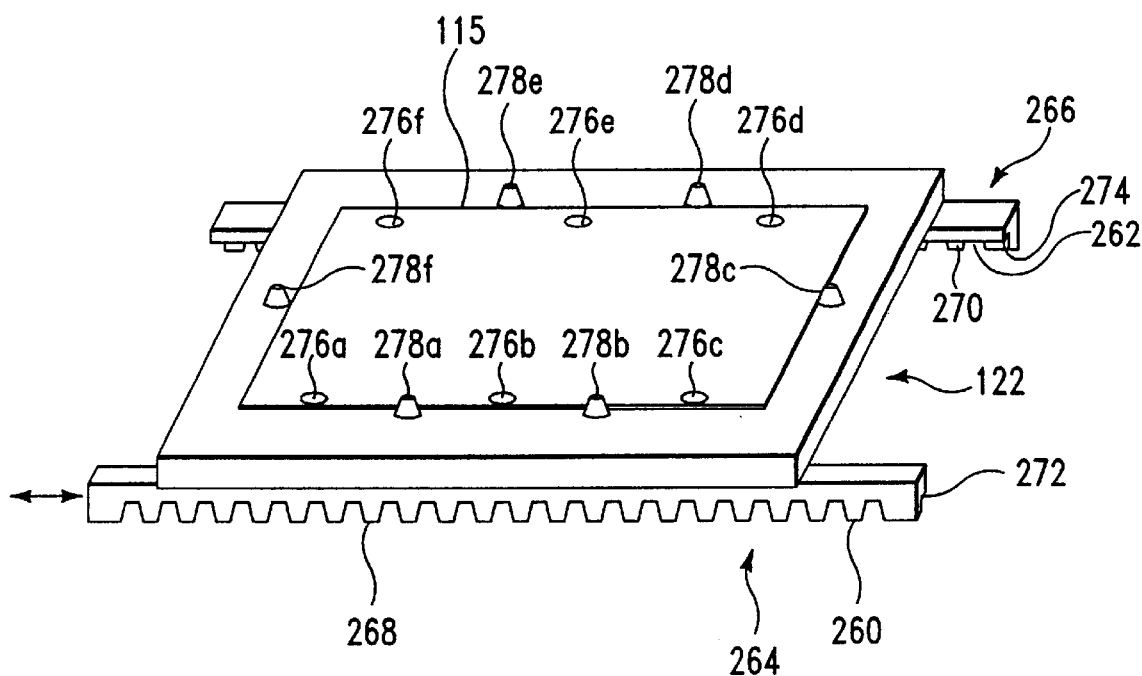
FIG. 12 is a schematic perspective view of a substrate carrier.

FIG. 12 is a schematic perspective view of a substrate carrier 122. The carrier 122 is preferably made of heat conductive material, such as aluminum or copper, and more preferably bead blasted and/or anodized aluminum. Bead blasting surfaces of an object can increase the emissivity of the surfaces. Emissivity is the ratio of radiation emitted from a surface relative to the radiation emitted from a black body at the same temperature. A high emissivity surface can be formed by a surface treatment that increases the emissivity relative to an untreated surface, such as by anodizing or bead blasting the surface, or a combination thereof. For example, a typical emissivity of an untreated aluminum surface is about 0.03 and is highly reflective. The surface emissivity can increase to a range of about 0.2 to about 0.4 by anodizing the surface or even higher to about 0.6 by bead blasting and anodizing the surface. Bead blasting can be accomplished for example by discharging 36 grit size garnet through a nozzle with an air pressure of about 80 pounds per square inch (psi) and impacting the aluminum surface until the aluminum appears greyish in color. Other pressures, materials, and grit sizes may be used as is known in the art.

The carrier 122 preferably has a toothed rack 260 with teeth 268 and an inward stepped surface 272 on a first side 264 and a toothed rack 262 with teeth 270 and an inward stepped surface 274 on a second side 266. The racks 260, 262 are similar to the racks 206, 208 of the transfer shuttle 118, shown in FIG. 8, and engage guide rollers 126 and pinions 128 in a similar manner. The carrier 122 supports the substrate 115 and provides a heat sink for the substrate. A plurality of holes 276a–f (generally holes 276) are disposed in the carrier 122 to allow pins 144 in the pin plate 132 shown in FIG. 13 to pass therethrough. The carrier 122 is preferably slightly larger than the substrate 115 and has guide stops 278a–f (generally guide stops 278) disposed thereon to retain the substrate 115 laterally.

Figure 13:
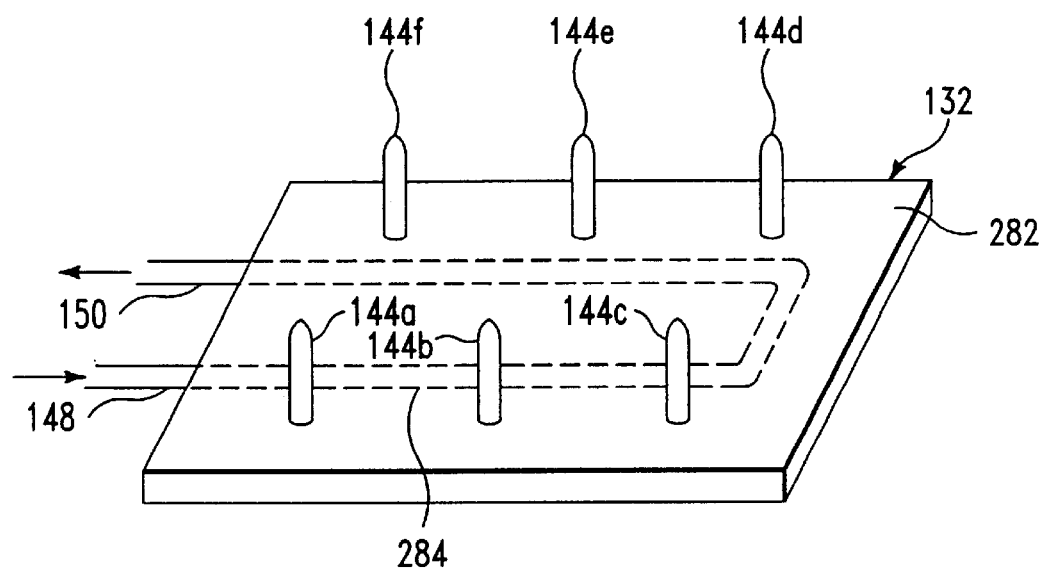
FIG. 13 is a schematic perspective view of a pin plate.

To establish the temperature of the carrier before and/or after processing, a cooling mechanism, such as a temperature controllable pin plate 132, is provided in the process chamber adjacent each of the load lock chambers. FIG. 13 is a schematic perspective view of the pin plate 132, which is provided adjacent the non-substrate receiving side of the carrier 122. The pin plate 132 is brought into contact with, or positioned immediately adjacent to, the carrier 122 to change the carrier temperature and hence the temperature of the substrate supported thereon. The pin plate 132 has a plurality of pins 144a–f (generally pins 144) disposed thereon extending upwardly from the surface 282 of the pin plate 132. The pins 144 are spaced in cooperation with the holes 276 in the carrier 122 so that the pins 144 can pass therethrough. Preferably, the pin plate 132 is temperature controllable by providing a channel 284 formed in the plate 132 through which a coolant such as water, glycol, or other suitable fluid passes. An inlet line 148 delivers the coolant to the channel 284 and an outlet line provides a conduit for the coolant away from the channel 284. The channel 284 can be formed, for example, by forming a portion of the channel 284 in two plates, sealing the plates together, or by drilling through different sides and ends of the pin plate 132 to make the passages and plugging various remaining holes, leaving an inlet to connect to the inlet line 148 and an outlet to connect to the outlet line 150. Also, the surface 282 preferably is a high emissivity surface formed, for example, by bead blasting and/or anodizing, so heat transfer is performed effectively.

When substrate 115, shown in FIG. 6, is raised by pin plate 132 to transfer the substrate between the carrier and the shuttle, the pin plate 132 makes physical contact with the carrier 122 and lowers the temperature of the carrier 122. Alternatively, the pin plate can be used to heat the carrier. By heating/cooling the calTier, the temperature of the substrate is inferentially raised or lowered to a desired temperature. The temperature may be monitored, so that the duration of physical contact for cooling or heating can be controlled. A shaft 136 is mounted to the underside of the pin plate 132 and a lift motor 140, shown in FIG. 7, is mounted to the shaft 136. The lift motor raises and lowers the shaft which raises and lowers the pin plate 132 as the pin plate transfers the substrate between the shuttle 118 and the carrier 122. The pin plate 134 can be similarly designed.

Figure 14:
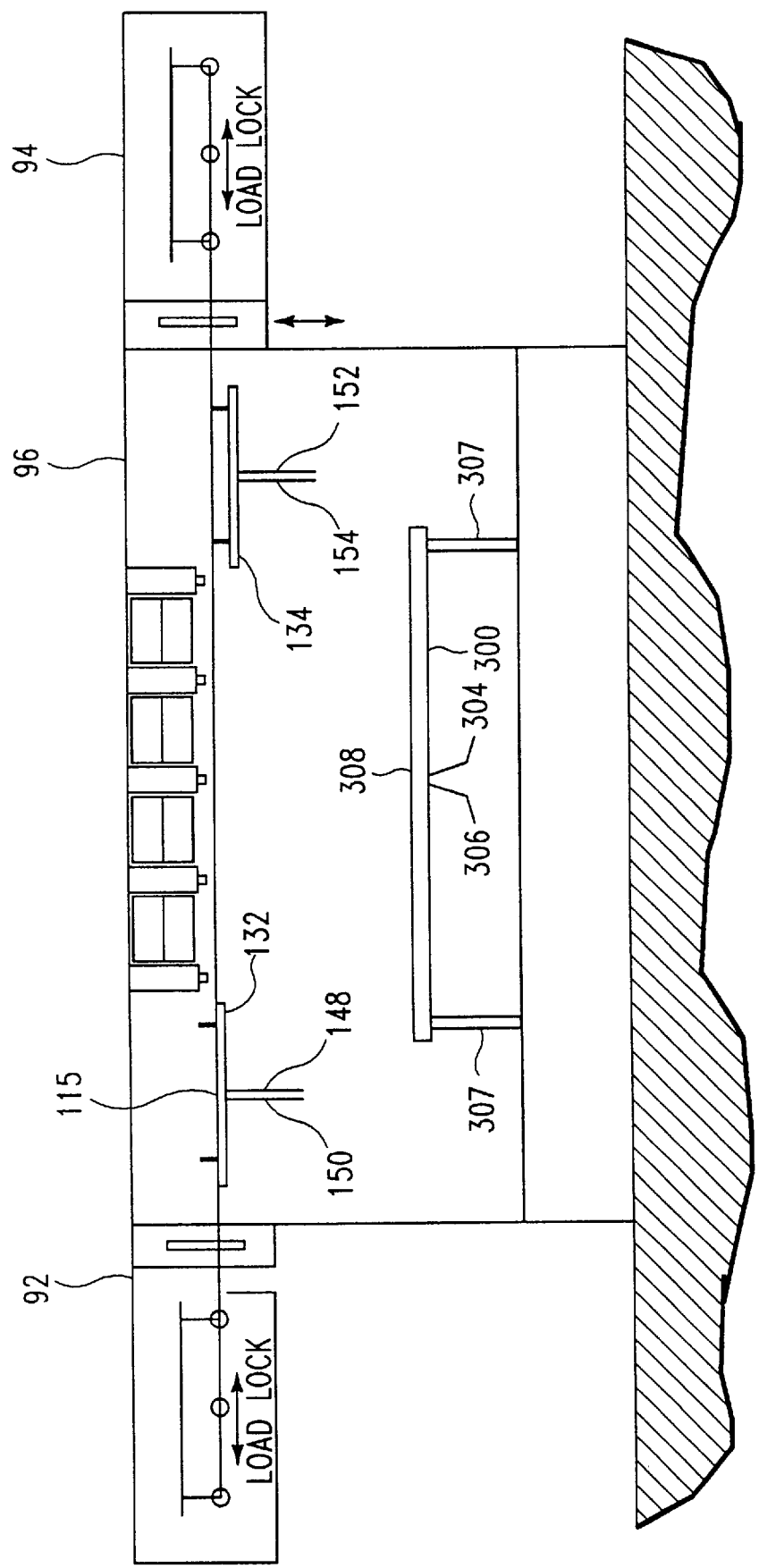
FIG. 14 is a schematic side view of another embodiment of the system shown in FIG. 6, having a temperature controllable plate.

FIG. 14 is a side view of another embodiment of the system shown in FIGS. 6–7. The system shown in FIG. 14 includes a plate 300, where the temperature of the plate 300 can be controlled in a similar fashion as the pin plates 132, 134 shown in FIGS. 6–7. Preferably, the plate 300 is cooled in like fashion as the pin plates, but if desired, the plate 300 can be heated. The plate 300 can be rectangularly shaped and can be mounted in several locations, such as between sidewalls of the processing chamber 96 or supported on a stand 307 that is connected to the bottom of the chamber. The plate 300 has a fluid inlet 304 and a fluid outlet 306 which can exit on a side of the plate or from underneath the plate. The plate 300 can lower the temperature in the processing chamber by radiantly transferring the cooled temperatures to various surfaces in the processing chamber. Preferably, the plate 300 is used in cooperation with the cooled pin plates 132, 134. A surface directed to the hotter surfaces of the chamber, such as a top 308 of the plate 300, can be treated to aid in emissivity. An increase in emissivity assists in transference of the radiant temperature of the plate 300 to the hotter surfaces inside the processing chamber 96, including a carrier 122 supporting a substrate 115. For instance, the plate 300 can be anodized or bead blasted or a combination thereof to increase emissivity.

Figure 15:
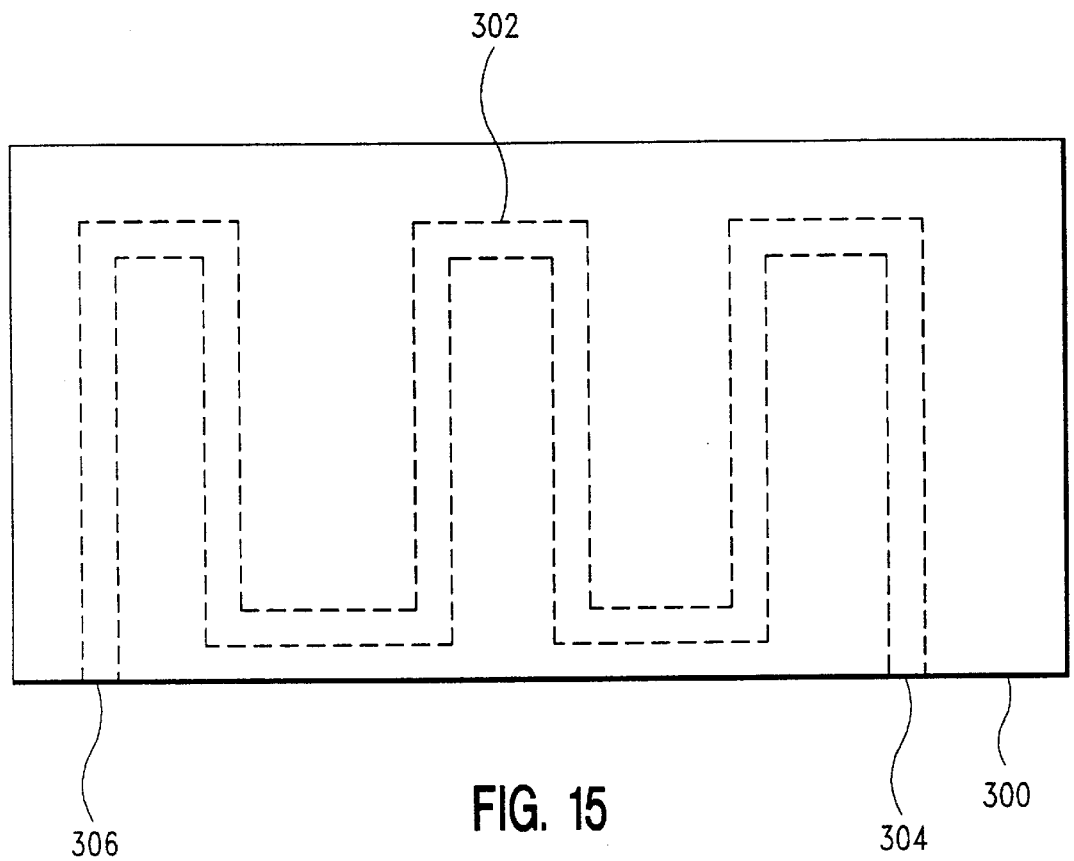
FIG. 15 is a schematic top view of the temperature controllable plate shown in FIG. 14.
Figure 16:
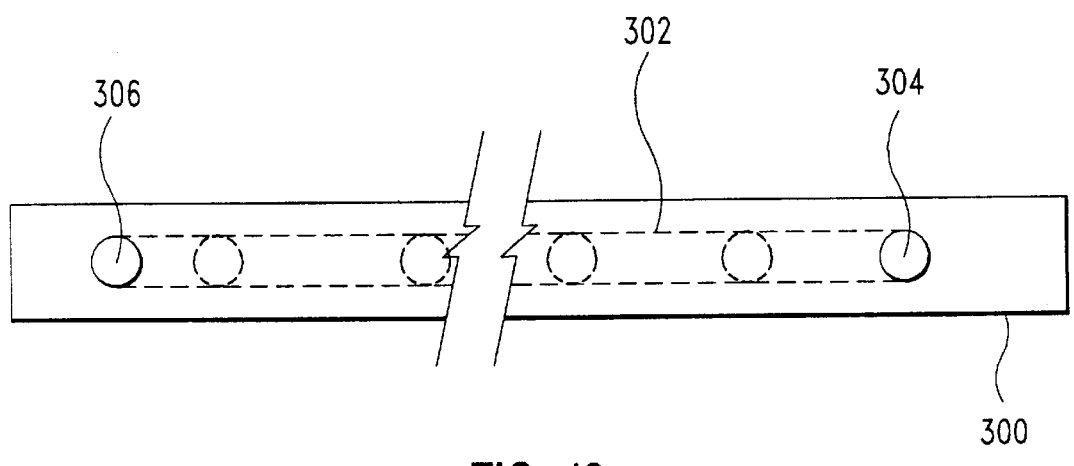
FIG. 16 is a schematic side view of the temperature controllable plate.

FIGS. 15 and 16 are top and side views of the plate 300, respectively. The plate 300 can have one or more channels 302 formed therein. Similar to the pin plate, the channels 302 can be formed in two plates which are then joined together to complete the channel. Alternatively, the channel 302 can be formed by drilling through the sides of the plate 300 and sealing portions of the channels at the plate sides to direct flow of a coolant through the plate 300 or other methods known to those in the art.

Figure 17:
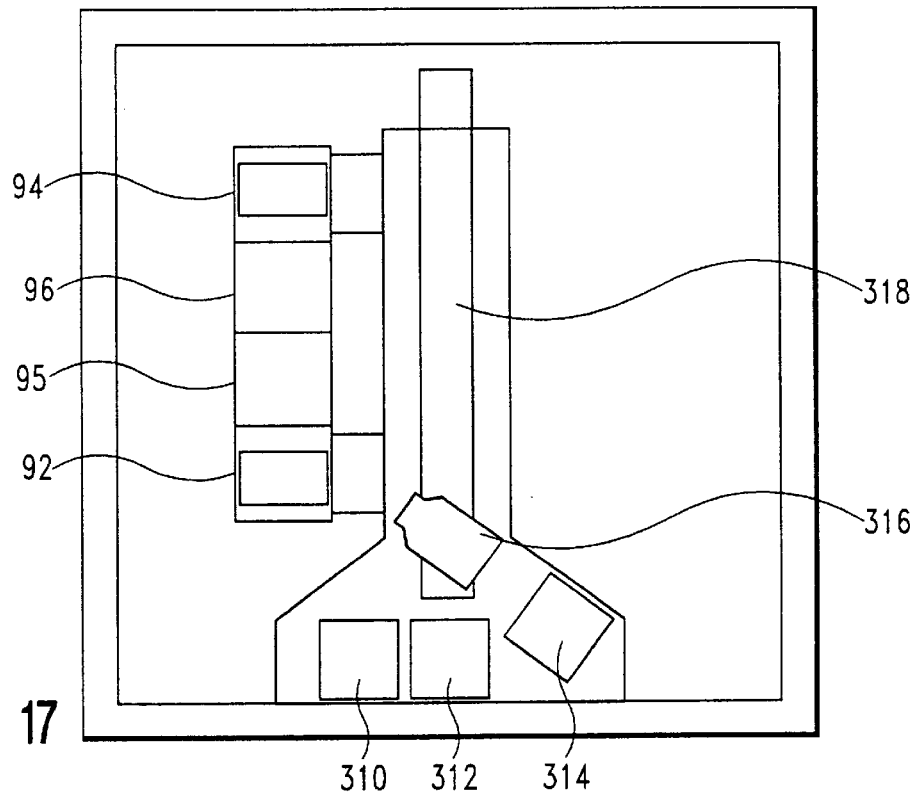
FIG. 17 is a top view diagram of a system having a pair of load lock chambers, processing chamber, and a robot.

The embodiment of the system shown in FIGS. 6–13 represents a single series of chambers. The invention can apply to multiple series of chambers disposed side-by-side or end-to-end with central receiving stations feeding the multiple series of chambers. FIG. 17 is a top view diagram of a system having a loading load lock chamber, processing chamber, unloading load lock chamber, and a robot. The system includes a unitary series of processing chambers 95, 96 coupled on one end to a loading load lock chamber 92 and on another end to a unloading load lock chamber 94. Cassettes 310, 312, and 314 are disposed at one end of a track 318 which supports a track robot 316 operated at atmospheric conditions. Each load lock chamber is coupled to the track robot 316. The system is similarly arranged as the series of chambers described in reference to FIGS. 6–13. Substrates are moved into the loading load lock chamber by a robot, processed, and retrieved from the unloading load lock chamber as described.

Figure 18:
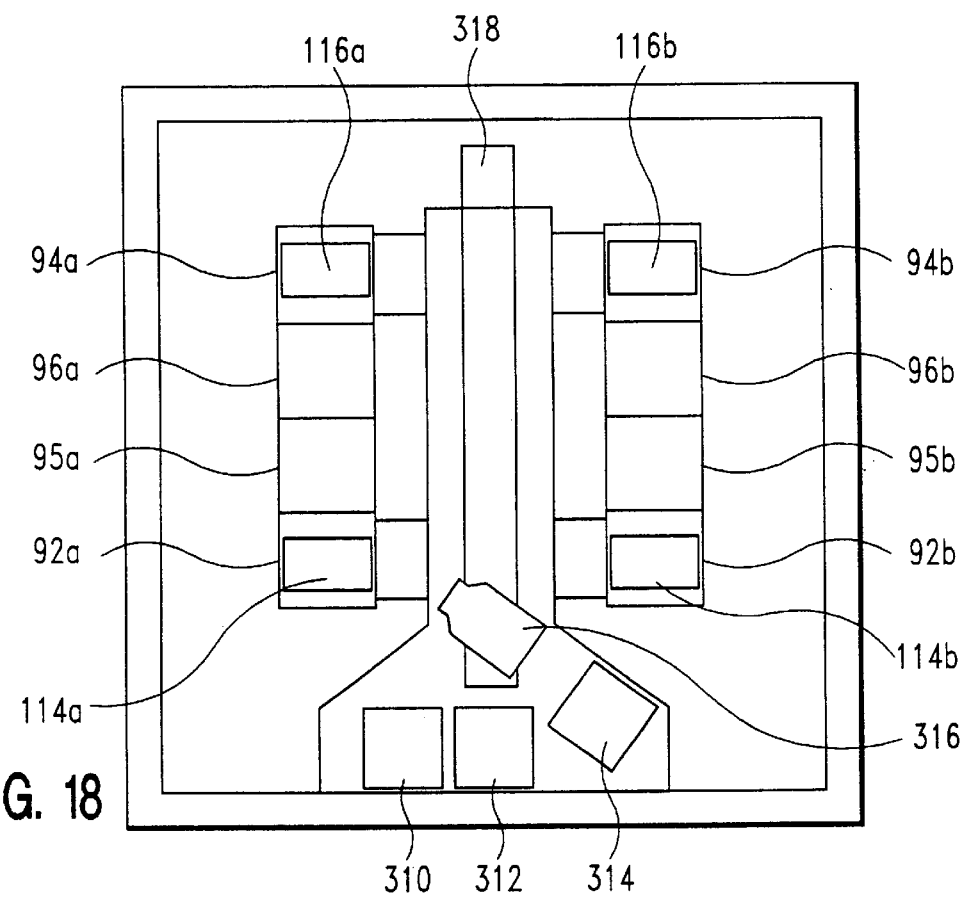
FIG. 18 is a top view diagram of a system having a two lines of chambers, each having two load lock chambers and a processing chamber with a robot disposed between the two lines.

FIG. 18 shows a variation of the system of FIG. 17 in which a bilateral series of chambers are coupled to a track robot 316. The first series of chambers includes processing chambers 95a, 96a to which one end is coupled to a loading load lock chamber 92a and another end is coupled to an unloading load lock chamber 94a. The second series includes processing chambers 95b, 96b coupled on one end to a loading load lock chamber 92b and coupled on another end to a unloading load lock chamber 94b. The throughput rate can be increased by the robot 316 loading a first substrate 114a into the first loading load lock chamber 92a in the first series of chambers and a second substrate 114b loaded into the second loading load lock chamber 114b in the second series of chambers while the first substrate 114a is being processed. Similarly, the substrate 116a can be unloaded by the robot while the substrate 116b is being transferred from the processing chamber 96b into the unloading load lock chamber 94b and awaiting removal by the robot 316. Depending on the timing and sequences in the chambers, other configurations could be possible, such as three or four series of chambers intersecting a central loading area with a robot.

Operation

Generally refelting to FIGS. 6 and 7, in operation, a substrate 114 is delivered to a loading load lock chamber 92 by a robot 110 through a valve 102 in the loading load lock chamber 92. The robot 110 places the substrate 114 on support fingers 198 disposed on a transfer shuttle 118. The robot 110 retracts from the loading load lock chamber 92 and the valve 102 closes. The loading load lock chamber 92 is brought to a vacuum of in the range of about 10 mTorr to about 50 mTorr for CVD processing and about 1 mTorr to about 5 mTorr for PVD processing by a vacuum source (not shown). In some load lock chambers, the substrate 114 can also be heated to a processing temperature by heat lamps, resistive coils, or other heating devices. The isolation valve 98 to the processing chamber 96 is opened and the shuttle 118 is moved along the track 123 by the pinion 128 rotatably engaging the rack 206 on the shuttle 118. A sensor (not shown) determines the position of the shuttle 118 and provides input to a controller 248 to control shuttle movement.

Inside the processing chamber 96, a carrier 122 is positioned over a pin plate 132 by moving the carrier 122 with a pinion 128 rotatably engaging a rack 260 on the carrier 122, similar to the shuttle 118. The shuttle 118 is brought into position over, and is aligned with, the carrier 122 and pins 144 from the pin plate 132. A lift motor 140 lifts a shaft 136 which raises the pin plate 132 into contact with the carrier 122. Pins 144 extend upward and through holes 276 in the carrier 122 and lift the substrate (designated 115 in the process chamber) from the support fingers 198 on the shuttle 118 supporting the substrate. The shuttle 118 retracts into the loading load lock chamber 92 and the isolation valve 98 closes, thereby sealing the processing chamber 96. The lift motor 140 lowers the shaft 136 and the pin plate 132, thus lowering the pins 144 supporting the substrate 115. The substrate 115 contacts the carrier 122 supporting surface and the pins 144 continue lowering until the pins are lowered at least below the carrier 122. The carrier 122 is moved along the track 124 by the pinion 128 engaging the rack 260 on the carrier 122 with sensors (not shown) sensing the carrier position and providing input for the controller 248. The guide rollers 126 contact the carrier 122 as it moves along the track 124 and assist in maintaining alignment of the carrier 122 along the track 124. Alternatively, the pins 144 could be separated from the pin plate 132 and raised and lowered independently of the pin plate 132 by, for example, using another lift motor (not shown) coupled to the pins. With a separation of the pins from the pin plate, the pin plate can contact the carrier longer while the pins raise and lower the substrate.

The carrier 122 is moved into position for processing. For example, if the processing includes sputtering, the carrier 122 is moved into position under at least one of the targets 156, 158, 160, 162. Power is supplied to the targets to bias the targets and a plasma is created. Ions from the plasma impact the targets and dislodge material from the targets. Some of the dislodged material travels in a path toward the substrate 115 and is deposited thereon. Partitions 171, 173, 175, 177, 179 assist in isolating the particular target being sputtered from adjacent processing zones and/or other targets. The leading edge of the substrate 115 is moved to the next processing zone in the series of processing zones 172, 174, 176, 178, such as another processing zone having a target made of a different material. Power is supplied to the target in the next processing zone, the target is sputtered, and target material is deposited over the previously deposited material. The processing continues through the series of processing zones 172, 174, 176, 178 until the substrate has been processed with the regime(s) for the particular processing chamber 96. As described herein, the processing zones are not required to be the same or greater size as the substrate because the substrate can move through the processing zone as the substrate is exposed to the processing environment in the particular zone. Once the substrate has passed through the processing zones, the carrier 122 is moved into position above, and aligned with, the pin plate 134 disposed adjacent the unloading load lock chamber 94. Alternatively, if another processing chamber is coupled in series with the processing chamber 96, the carrier can be moved into the next chamber or the substrate can be transferred to another carrier in the next processing chamber. The pin plate 134 is raised, the pins 146 extend through the carrier 122, thereby lifting the substrate 115 above the carrier 122. A transfer shuttle 120 in the unloading load lock chamber 94 is moved along the track 125 from the unloading load lock chamber 94, through an isolation valve 100 between the unloading load lock chamber 94 and the processing chamber 96, and into position above the carrier 122 with the fingers 198 disposed below the raised substrate 115. A motor 142 lowers the pins 146 which lower the substrate 115 onto the fingers 198 of the shuttle 120. The shuttle 120 moves back through the isolation valve 100 into the unloading load lock chamber 94 and the isolation valve 100 closes to again seal the processing chamber. The unloading load lock chamber 94 can provide cooling for the substrate (designated 116 in the unloading load lock chamber) before opening a valve 104 to allow a robot 112 to retrieve the substrate 116 for further processing. A plurality of substrates can be disposed in the chambers simultaneously, such as substrate 114 in the loading load lock chamber 92 awaiting transfer to the carrier 122, substrate 115 being processed in the process chamber 96, and substrate 116 awaiting transfer out of the unloading load lock chamber 94.

The carrier 122 is moved back along the track 124 toward the loading load lock chamber 92 into position for another substrate from the loading load lock chamber 92. Alternatively, if the process chamber sequence enables flexibility, each load lock chamber can serve as both loading and unloading load lock chambers. A substrate for processing can be placed on the carrier 122 from the unloading load lock chamber 94 and moved back through the processing chamber 96 toward the loading load lock chamber 92, where the substrate is then moved for loading into the loading load lock chamber.

Figure 1:
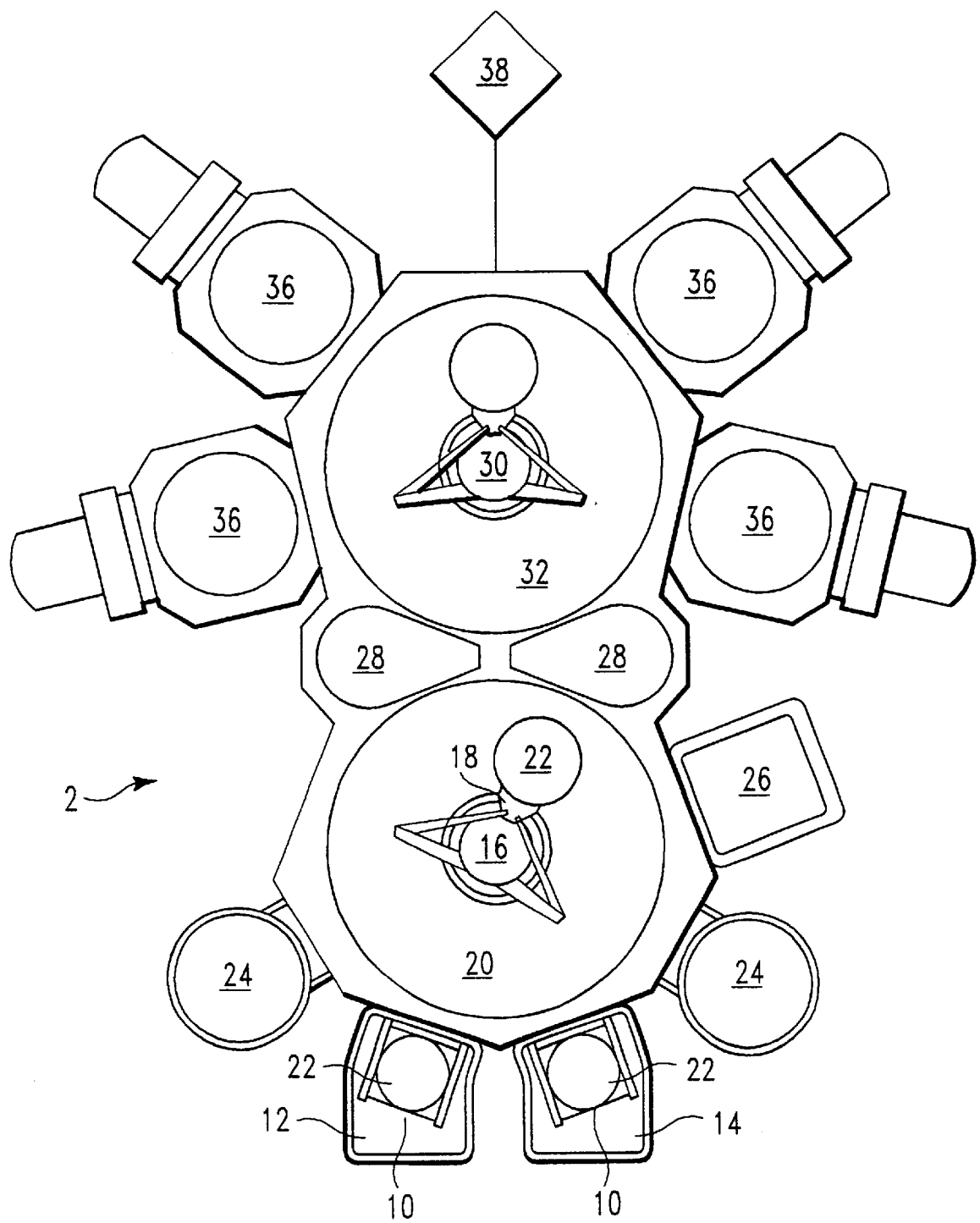
FIG. 1 is a schematic top view of a typical cluster tool system.
Figure 2:
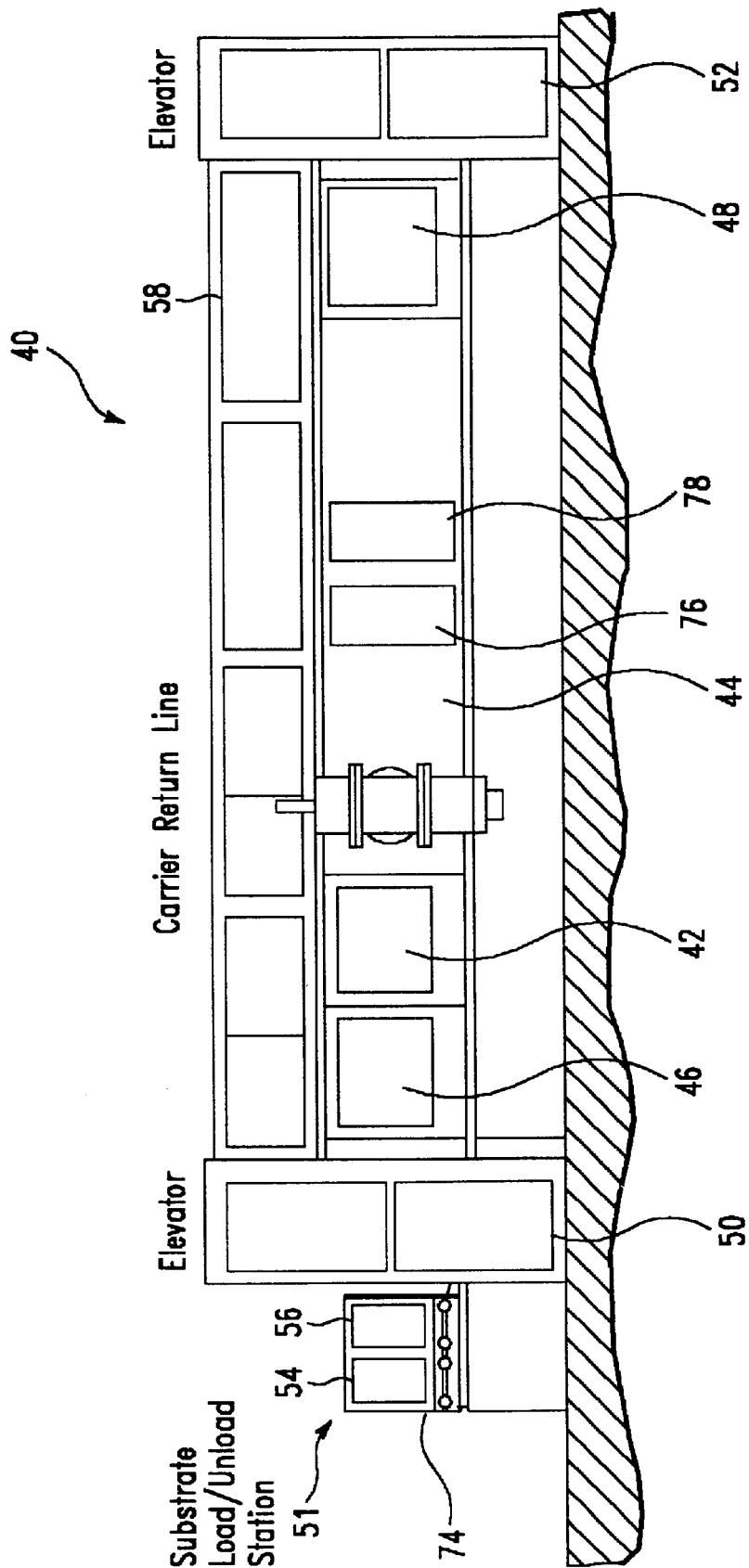
FIG. 2 is a schematic side view of a typical inline system.
Figure 3:
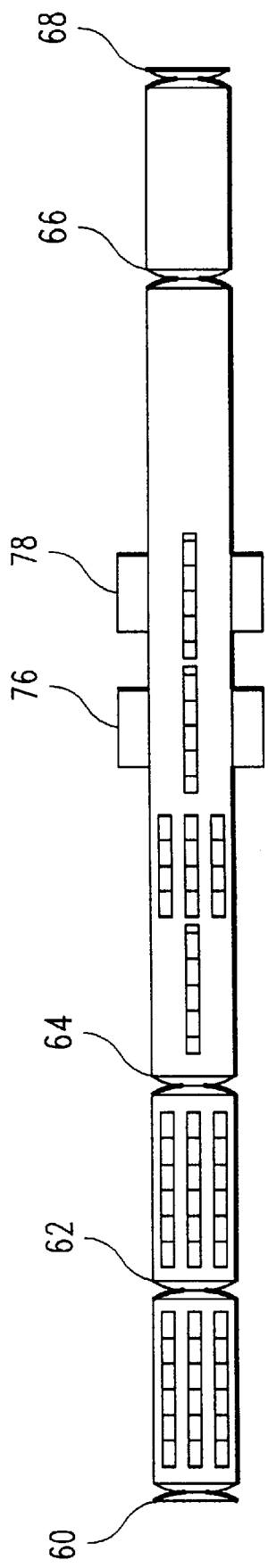
FIG. 3 is a schematic top view of the chambers in the inline system shown in FIG. 2.
Figure 5:
FIG. 5 is a schematic end view of a substrate carrier in the inline system.
Figure 4:
FIG. 4 is a schematic side view of a substrate carrier in the inline system.

Preferably, the carrier 122 does not leave a processing environment and is not subjected to the varying temperature fluctuations and thermal cycles nor the exposure to contaminating environments as with the inline system 40, shown in FIG. 2. The shuttles 118, 120 are positioned briefly in the processing chamber 96, principally retained in the respective load lock chambers 92, 94 and do not receive the depositions of material or other processing results that the carrier 122 receives. Thus, the invention provides a separation of the different support components into those components that are at least principally, and preferably wholly, retained in the processing environment and those components that are at least principally retained in a non processing environment. The invention also assists in controlling the temperature of the carrier retained in the processing environment by intermittently contacting a temperature controllable plate, such as between deposition cycles or when loading or unloading the substrates from and to shuttles, or by being in proximity to the plate so as to affect the carrier temperature. Preferably, the carrier is cooled by the temperature controllable plate to avoid the average temperature of the carrier from "creeping" upward due to the heat of the substrate processing.

Example Process—ITO/MoCr/MoCr Sputtered Deposition

The processing system can be used on a wide variety of processes with differing materials and process regimes. The following example merely illustrates one possibility in using reactive and non reactive processing zones, represented schematically in the side views of FIGS. 19–23. One substance currently being deposited on glass substrates for flat glass panels is indium tin oxide (ITO). One or more molybdenum chromium (MoCr) layers are deposited over the ITO layer. Other examples of typical materials for flat glass substrates include Cr, ITO, CrO, Ta, and Al.

A substrate was loaded onto a shuttle 118 in a loading load lock chamber 92, a vacuum was created in the loading load lock chamber 92 of about 1 mTorr to about 50 mTorr, and the shuttle 118 moved the substrate 115 into the processing chamber 96. The substrate 115 was transferred to a carrier 122 positioned over a pin plate 132, the shuttle 118 returned to the loading load lock chamber 92, and the pin plate 132 lowered. As represented in FIG. 19, the carrier 122 moved the substrate 115 into a processing position under the first processing zone 320 containing an ITO target 326. Argon or other inert gases were flown into the processing zone at the rate of about 34 standard cubic centimeters (sccm), to stabilize the process and assist in evacuating the first processing zone of contaminants. Diatomic oxygen was also flown into the first processing zone at a rate of about 0.17 sccm. About 2000 watts were applied to the ITO target 326 positioned above or adjacent the substrate 115, a plasma was created, and the ITO target 326 was sputtered to produce an ITO layer thickness of about 500 Å on the substrate in about 40 seconds. As represented in FIG. 20, due to the size of the substrate 115, the carrier moved a portion of the substrate 115 past the second processing zone 322 and third processing zone 324 to finish processing of the substrate 115 in the first processing zone 320.

As represented in FIG. 21, the substrate 115 was moved to a second processing zone 322 which can be adjacent the first processing zone or remote to the first processing zone. Due to the size of the substrate and the proximity of the first processing zone to the second processing zone, the carrier direction was reversed to move the substrate 115 into alignment with the second processing zone 322. Alternatively, the second processing zone 322 can be activated for deposition as the substrate 115 also moves through the first processing zone 320. In this example, the second processing zone 322 included a MoCr target 328. To deposit other materials, corresponding targets of like material could be used, including for example, Cr, ITO, Ta, and Al targets with and without oxidizing and other reactant gases. A reactive process was used to produce an oxidized layer of sputtered MoCr on the substrate 115 to promote adhesion between the deposited ITO layer and subsequent layers. Argon or other inert gases were flown into the second processing zone 322 at the rate of about 30 sccm. Diatomic oxygen was also flown into the second processing zone 322 at a rate of about 30 sccm to provide a reactive gas to react with the MoCr sputtered material and produce the oxidized adhesion layer of MoCrO. About 1000 watts were applied to the MoCr target 328 positioned above the substrate 115, a plasma was created, and the MoCr target 328 was sputtered in the presence of the oxygen to produce a MoCrO layer thickness of about 14 Å in about 4 seconds.

As represented in FIG. 22, the carrier 122 again reversed direction and moved the substrate 115 into a position to be processed for another layer. In this example, a 2000 Å thick layer of MoCr in a non-reactive process was deposited on the MoCrO layer. Both of the processing zones containing MoCr targets 328, 330 were used for a higher throughput rate. Argon or other inert gases were flown into each processing zone at the rate of about 75 sccm. Substantially no oxygen was flown into the second or third processing zones 322, 324 respectively. About 13000 watts were applied to the each of the MoCr targets 328, 330 positioned above the substrate 115, a plasma was created in the processing zones 322, 324, and the MoCr targets 328, 330 were sputtered for about 44 seconds to produce a MoCr layer thickness of about 2000 Å.

As represented in FIG. 23, the substrate was removed from the processing zones 320, 322, 324 to be transferred to an unloading load lock chamber 94 for further processing.

Variations in the orientation of the shuttle, carrier, substrates, robot, chambers, targets and other system components are possible. Additionally, all movements and positions, such as "above", "top", "below", "under", "bottom", "side", described herein are relative to positions of objects such as the targets, chambers, carriers and shuttles. Accordingly, it is contemplated by the present invention to orient any or all of the components to achieve the desired movement of substrates through a processing system.

While foregoing is directed to the preferred embodiment of the present invention, other and further embodiments of the invention may be devised without departing from the basic scope thereof, and the scope thereof is determined by the claims that follow.

What is claimed is:

1. A substrate processing system, comprising:
   a) at least one processing chamber;
   b) at least one load lock chamber coupled to the processing chamber;
   c) a shuttle disposed in the load lock chamber and communicable with the processing chamber; and
   d) a substrate carrier primarily disposed in the at least one processing chamber and adapted to operate solely within the processing chamber.

2. The processing system of claim 1, wherein the system comprises at least two load lock chambers mounted on opposing sides of the at least one processing chamber.

3. The processing system of claim 1, further comprising a robot disposed adjacent the at least one load lock chamber and communicable with the load lock chamber.

4. The processing system of claim 1, further comprising a pin plate disposed at least partially in the processing chamber and moveable between a first vertical position and a second vertical position.

5. The processing system of claim 4, wherein the pin plate comprises a plurality of pins connected to the plate.

6. The processing system of claim 5, wherein the pin plate comprises a fluid channel disposed within the pin plate.

7. The processing system of claim 1, further comprising a temperature controllable plate disposed in proximity to at least one processing zone in the processing chamber.

8. The processing system of claim 7, wherein the temperature controllable plate comprises at least one surface having an emissivity of at least 0.2.

9. The processing system of claim 1, further comprising a plurality of processing zones within one processing chamber.

10. The processing system of claim 9, further comprising a plurality of partitions separating the processing zones.

11. The processing system of claim 10, further comprising at least one gas inlet connected to one or more of the processing zones.

12. The processing system of claim 11, wherein each processing zone comprises a separate gas inlet.

13. The processing system of claim 1, further comprising a track having guide rollers and pinion gears disposed at least partially within the processing chamber.

14. The processing system of claim 13, further comprising a controller coupled to the track.

15. The processing system of claim 13, wherein the shuttle and substrate carrier each comprises at least one rack disposed on the track.

16. The processing system of claim 1, further comprising at least two lines of chambers each comprising at least one load lock chamber and at least one processing chamber, and further comprising at least one robot disposed between the at least two lines of chambers.

17. The processing system of claim 1, wherein the system comprises a reactive processing environment and a non reactive processing environment in the same processing chamber.

18. The processing system of claim 13, wherein the system comprises one or more motors coupled to the track wherein the one or more motors reversibly move the substrate carrier along the track.

19. The processing system of claim 18, wherein the one or more motors comprises at least one reversible motor.

20. A substrate processing system, comprising:
   a) at least one processing chamber;
   b) at least one load lock chamber coupled to the processing chamber;
   c) a shuttle movable between a load lock chamber and the processing chamber; and
   d) a temperature controllable substrate carrier disposed at least partially in the processing chamber.

21. The processing system of claim 20, further comprising a temperature controllable pin plate disposed in the processing chamber.

22. The processing system of claim 21, wherein the pin plate comprises a fluid channel formed therein.

23. The processing system of claim 21, wherein the pin plate further comprises a bead blasted upper surface.

24. The processing system of claim 21, further comprising a controller that controls movement of the pin plate.

25. A substrate processing system, comprising:
   a) at least one processing chamber;
   b) at least one load lock chamber coupled to the processing chamber;
   c) a shuttle movable between the load lock chamber and the processing chamber; and
   d) at least two processing zones within one processing chamber.

26. The processing system of claim 25, further comprising partitions adjacent the processing zones that at least partially separate the processing zones.

27. The processing system of claim 25, wherein at least one processing zone that reactively processes a substrate disposed adjacent the processing zone.

28. A substrate processing apparatus, comprising:
   a) a plate;
   b) one or more channels disposed at least partially within the plate and having an outlet and an inlet; and
   c) a plurality of upward projecting pins connected to the plate that engage a substrate carrier in a substrate processing system.

29. The substrate processing apparatus of claim 28, wherein the plate has at least one anodized surface.

30. The substrate processing apparatus of claim 28, wherein the plate has at least one bead blasted surface.

31. The substrate processing apparatus of claim 28, further comprising a shaft coupled to the plate.

32. The substrate processing apparatus of claim 31, further comprising a lift motor coupled to the shaft.

33. A substrate processing system, comprising:
   a) a substrate carrier;
   b) a temperature controllable plate disposed in proximity to the substrate carrier; and
   c) a fluid channel coupled to the temperature controllable plate.

34. The substrate processing system of claim 33, wherein the temperature controllable plate cools the substrate carrier with cooled radiant surfaces.

35. The substrate processing system of claim 33, wherein the temperature controllable plate affects a temperature of the substrate carrier by an increased emissivity surface treatment on the temperature controllable plate.

36. The substrate processing system of claim 33, wherein the temperature controllable plate affects a temperature of the substrate carrier by intermittent engagement with the substrate carrier.

37. The substrate processing system of claim 36, further comprising a controller coupled to the temperature controllable plate that controls the engagement of the temperature controllable plate with the substrate carrier.

38. A method of processing substrates, comprising:
a) disposing a substrate in a processing chamber of a substrate processing system;
b) positioning the substrate adjacent a first processing zone disposed in the processing chamber and open to the processing chamber;
c) processing the substrate with a first process in the first processing zone;
d) positioning the substrate adjacent a second processing zone disposed in the processing chamber and open to the processing chamber; and
e) processing the substrate in the second processing zone with a different process than the first process in the first processing zone.

39. The method of claim 38, wherein processing the substrate in the second processing zone comprises processing with a different process than the first process in the first processing zone.

40. The method of claim 38, further comprising altering the first processing zone after the first process to a different process than the first process.

41. The method of claim 38, further comprising reversing the direction of the substrate from a first direction through the first processing zone to a second direction through the second processing zone.

42. The method of claim 38, wherein the first process comprises a reactive process.

43. A method of processing substrates, comprising:
a) transferring a substrate to a carrier disposed in a processing chamber of a substrate processing system; then
b) processing the substrate in the processing chamber; and then
c) transferring the substrate from the carrier to a space outside the processing chamber.

44. The method of claim 43, further comprising retaining the carrier in the processing chamber during the transferring and processing of the substrate.

45. The method of claim 43, further comprising reversing the direction of the carrier inside the processing chamber.

46. A method of processing substrates, comprising:
a) disposing a substrate carrier in a processing chamber of a substrate processing system;
b) supporting a substrate on the substrate carrier;
b) processing a substrate in the processing chamber; and
c) altering a substrate carrier temperature inside the processing chamber.

47. The method of claim 46, wherein altering the substrate carrier temperature comprises engaging the substrate carrier with a pin plate.

48. The method of claim 47, further comprising determining the temperature of the substrate carrier and controlling the engagement of the substrate carrier with the pin plate.

49. The method of claim 46, wherein cooling the substrate carrier comprises radiating cooled temperatures from a temperature controllable plate disposed in proximity to the substrate carrier.

* * * * *

UNITED STATES PATENT AND TRADEMARK OFFICE
CERTIFICATE OF CORRECTION

PATENT NO. : 6,298,685 B1
DATED : October 9, 2001
INVENTOR(S) : Tepman

It is certified that error appears in the above-identified patent and that said Letters Patent is hereby corrected as shown below:

Title page,
FOREIGN PATENT DOCUMENTS, please replace "2284 105" with -- 2284 105A --.

Column 7,
Line 9, please replace "calTied" with -- carried --.
Line 16, please replace "arc" with -- are --.

Column 10,
Line 32, please replace "calTier" with -- carrier --.

Column 14,
Line 57, please replace "to the each" with -- to each --.

Signed and Sealed this

Twenty-third Day of April, 2002

Attest:

Attesting Officer

JAMES E. ROGAN
Director of the United States Patent and Trademark Office